United States Patent
D'Evelyn et al.

(10) Patent No.: US 10,975,492 B2
(45) Date of Patent: *Apr. 13, 2021

(54) METHOD OF FORMING A GAN SINGLE CRYSTAL COMPRISING DISPOSING A NUCLEATION CENTER IN A FIRST REGION, A GAN SOURCE MATERIAL IN A SECOND REGION, AND ESTABLISHING A TEMPERATURE DISTRIBUTION

(71) Applicant: Soraa, Inc., Fremont, CA (US)

(72) Inventors: Mark Philip D'Evelyn, Niskayuna, NY (US); Kristi Jean Narang, Voorheesville, NY (US); Dong-Sil Park, Niskayuna, NY (US); Huicong Hong, Niskayuna, NY (US); Xian-An Cao, Morgantown, WV (US); Larry Qiang Zeng, Strongsville, OH (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 96 days.

This patent is subject to a terminal disclaimer.

(21) Appl. No.: 16/246,065

(22) Filed: Jan. 11, 2019

(65) Prior Publication Data

US 2019/0249328 A1    Aug. 15, 2019

Related U.S. Application Data

(63) Continuation of application No. 15/061,069, filed on Mar. 4, 2016, now Pat. No. 10,208,396, which is a
(Continued)

(51) Int. Cl.
*C30B 7/10* (2006.01)
*C30B 7/00* (2006.01)
(Continued)

(52) U.S. Cl.
CPC .............. *C30B 7/005* (2013.01); *C30B 7/105* (2013.01); *C30B 9/08* (2013.01); *C30B 19/02* (2013.01);
(Continued)

(58) Field of Classification Search
CPC .. C30B 7/00; C30B 7/005; C30B 7/10; C30B 7/105; C30B 9/00; C30B 9/04;
(Continued)

(56) References Cited

U.S. PATENT DOCUMENTS 4,019,950 A *  4/1977  Croxall ................. C01G 21/14
                                                                117/71
4,785,667 A    11/1988  Miyajima
(Continued)

FOREIGN PATENT DOCUMENTS

CN    1345474     4/2002
CN    1462060     12/2003
(Continued)

OTHER PUBLICATIONS

Andre et al; "Low dislocation density high quality thick hydride vapour phase epitaxy (HVPE) GaN layers", Journal of Crystal Growth vol. 306 (2007) pp. 86-93.
(Continued)

Primary Examiner — Kenneth A Bratland, Jr.
(74) Attorney, Agent, or Firm — Patterson + Sheridan, LLP

(57) ABSTRACT

A method for growing a crystalline composition, the first crystalline composition may include gallium and nitrogen. The crystalline composition may have an infrared absorption peak at about 3175 cm$^{-1}$, with an absorbance per unit thickness of greater than about 0.01 cm$^{-1}$. In one embodiment, the composition ay have an amount of oxygen present in a concentration of less than about $3 \times 10^{18}$ per cubic
(Continued)

centimeter, and may be free of two-dimensional planar boundary defects in a determined volume of the first crystalline composition.

21 Claims, 12 Drawing Sheets

Related U.S. Application Data continuation of application No. 11/558,048, filed on Nov. 9, 2006, now Pat. No. 9,279,193, which is a continuation-in-part of application No. 11/376,575, filed on Mar. 15, 2006, now abandoned, which is a continuation-in-part of application No. 11/010,507, filed on Dec. 13, 2004, now Pat. No. 7,078,731, which is a continuation-in-part of application No. 10/329,981, filed on Dec. 27, 2002, now Pat. No. 7,098,487.

(51) Int. Cl.
*C30B 9/08* (2006.01)
*C30B 19/02* (2006.01)
*C30B 19/12* (2006.01)
*C30B 25/02* (2006.01)
*C30B 25/20* (2006.01)
*C30B 29/40* (2006.01)
*C30B 29/68* (2006.01)

(52) U.S. Cl.
CPC .............. *C30B 19/12* (2013.01); *C30B 25/02* (2013.01); *C30B 25/20* (2013.01); *C30B 29/406* (2013.01); *C30B 29/68* (2013.01)

(58) Field of Classification Search
CPC .......... C30B 9/08; C30B 19/02; C30B 19/12; C30B 23/00; C30B 23/02; C30B 23/06; C30B 25/00; C30B 25/02; C30B 25/18; C30B 25/20; C30B 29/00; C30B 29/10; C30B 29/40; C30B 29/403; C30B 29/406; C30B 29/68
USPC ... 117/11, 54, 56, 64–65, 68, 71, 84, 88–89, 117/91, 99–100, 102, 105, 109, 937, 952
See application file for complete search history.

(56) References Cited

U.S. PATENT DOCUMENTS

| | | | |
|---|---|---|---|
| 5,433,169 A | 7/1995 | Nakamura | |
| 5,637,531 A | 6/1997 | Porowski | |
| 5,838,706 A | 11/1998 | Edmond | |
| 5,851,905 A | 12/1998 | McIntosh | |
| 5,962,875 A | 10/1999 | Motoki | |
| 5,965,875 A | 10/1999 | Merrill | |
| 5,981,400 A | 11/1999 | Lo | |
| 6,248,607 B1 | 6/2001 | Tsutsui | |
| 6,273,948 B1 | 8/2001 | Porowski | |
| 6,294,440 B1 | 9/2001 | Tsuda | |
| 6,398,867 B1 | 6/2002 | D'Evelyn et al. | |
| 6,468,882 B2 | 10/2002 | Motoki | |
| 6,521,917 B1 | 2/2003 | Takayama | |
| 6,533,874 B1 | 3/2003 | Vaudo | |
| 6,596,079 B1 | 7/2003 | Vaudo | |
| 6,613,143 B1 | 9/2003 | Melnik | |
| 6,627,552 B1 | 9/2003 | Nishio | |
| 6,806,508 B2 | 10/2004 | D'Evelyn et al. | |
| 6,838,741 B2 | 1/2005 | Sandvik | |
| 6,936,488 B2 | 8/2005 | D'Evelyn et al. | |
| 6,939,488 B2 | 9/2005 | Blomacher et al. | |
| 7,009,215 B2 | 3/2006 | D'Evelyn et al. | |
| 7,078,731 B2 | 7/2006 | D'Evelyn et al. | |
| 7,098,487 B2 | 8/2006 | D'Evelyn et al. | |
| 7,582,498 B2* | 9/2009 | D'Evelyn ................. C30B 9/00 117/216 |
| 7,638,815 B2 | 12/2009 | D'Evelyn et al. | |
| 7,786,503 B2 | 8/2010 | D'Evelyn et al. | |
| 7,859,008 B2 | 12/2010 | D'Evelyn et al. | |
| 9,279,193 B2* | 3/2016 | D'Evelyn ............ C30B 29/406 |
| 2001/0008299 A1 | 7/2001 | Linthicum | |
| 2001/0011772 A1 | 8/2001 | Fukasawa | |
| 2002/0155634 A1 | 10/2002 | D'Evelyn et al. | |
| 2002/0166502 A1 | 11/2002 | Vaudo | |
| 2002/0192507 A1* | 12/2002 | Dwilinski ................. C30B 7/10 428/698 |
| 2003/0141301 A1 | 7/2003 | D'Evelyn et al. | |
| 2003/0183155 A1 | 10/2003 | D'Evelyn et al. | |
| 2003/0209185 A1 | 11/2003 | Ueno | |
| 2004/0040490 A1 | 3/2004 | Yamanaka | |
| 2004/0124435 A1 | 7/2004 | D'Evelyn et al. | |
| 2004/0134415 A1 | 7/2004 | D'Evelyn et al. | |
| 2004/0195598 A1 | 10/2004 | Tysoe | |
| 2004/0245535 A1 | 12/2004 | D'Evelyn et al. | |
| 2005/0029537 A1 | 2/2005 | D'Evelyn et al. | |
| 2005/0087753 A1 | 4/2005 | D'Evelyn et al. | |
| 2005/0098095 A1 | 5/2005 | D'Evelyn et al. | |
| 2005/0098844 A1 | 5/2005 | Sandvik | |
| 2005/0152820 A1 | 7/2005 | D'Evelyn et al. | |
| 2005/0167692 A1 | 8/2005 | Ishida | |
| 2006/0169996 A1 | 8/2006 | D'Evelyn et al. | |
| 2006/0191472 A1* | 8/2006 | Dwilinski ................. C30B 7/08 117/81 |
| 2007/0158785 A1 | 7/2007 | D'Evelyn et al. | |

FOREIGN PATENT DOCUMENTS

| | | | |
|---|---|---|---|
| EP | 0937790 | 8/1999 | |
| EP | 0966047 | 12/1999 | |
| EP | 1172464 | 1/2002 | |
| EP | 1249522 | 10/2002 | |
| FR | 2796657 | 1/2001 | |
| JP | H01230492 | 9/1989 | |
| JP | H07133181 | 5/1995 | |
| JP | H10236751 | 9/1998 | |
| JP | H11171699 | 6/1999 | |
| JP | 2000012900 | 1/2000 | |
| JP | 2000022212 | 1/2000 | |
| JP | 2001053339 | 2/2001 | |
| JP | 2001274140 | 10/2001 | |
| JP | 2001291703 | 10/2001 | |
| JP | 2002029897 | 1/2002 | |
| JP | 2002261075 | 9/2002 | |
| JP | 2002343718 | 11/2002 | |
| JP | 2003197534 | 7/2003 | |
| JP | 2003328759 | 11/2003 | |
| JP | 2006513122 | 4/2006 | |
| WO | 9641906 | 12/1996 | |
| WO | 0124921 | 4/2001 | |
| WO | WO-0124921 A1 * | 4/2001 | ............. B01J 3/062 |
| WO | 0234972 | 5/2002 | |
| WO | 02090763 | 11/2002 | |
| WO | 02101120 | 12/2002 | |
| WO | 02101125 | 12/2002 | |
| WO | 2004053206 | 6/2004 | |
| WO | 2004053208 | 6/2004 | |
| WO | 2004060548 | 7/2004 | |
| WO | 2005041283 | 5/2005 | |
| WO | 2005043638 | 5/2005 | |
| WO | 2005122232 | 12/2005 | |

OTHER PUBLICATIONS

Balaji Raghothamachar et al., "Synchrotron White Beam Topography Characterization of Physical Vapor Transport Grown AlN and Ammonothermal GaN", Elsevier, Journal of Crystal Growth, vol. 246, pp. 271-280, 2002.

Bockowski, M., "Review: Bulk growth of gallium nitride: challenges and difficulties," Institute of High Pressure Physics, PAS,

(56) References Cited

OTHER PUBLICATIONS

Sokolowska, 29/37, 01-142 Warsaw Poland, Cryst. Res. Technol. 42, No. 12, 1162-1175 (2007).
Byrappa et al., "Handbook of Hydrothermal Technology: A Technology for Crystal Growth and Materials Processing," Noyes Publications, Park Ridge, New Jersey, 2001, pp. 94-96 and 152.
D. Hanser et al., "Growth and Fabrication of 2 Inch Free-Standing GaN Substrates via the Boule Growth Method", Mat. Res. Soc. Symp. Proc, vol. 798, pp. Y2.1.1-Y.2.1.6, 2004.
D'Evelyn, et al., "Bulk GaN Crystal Growth by the High-Pressure Ammonothermal Method", Journal of Crystal Growth, Elsevier, Amsterdam, NL, vol. 300, No. 1, pp. 11-16, 2007.
Denis, et al., "Gallium Nitride Bulk Crystal Growth Processes: A Review", Materials Science and Engineering R: Reports, Elsevier Sequoia S.A., Lausanne, CH, vol. 50, No. 6, pp. 167-194, 2006.
Dwilinski et al, Ammono Method of BN, AIN, and GaN Synthesis and Crystal Growth: Journal of Nitride Semiconductor Research, 1998, 3, 25, MRSInternet: http://nsr.mij.mrs.org, 4 pages.
Dwilinski, R. et al., Exciton Photo-Luminescence of GaN Bulk Crystals Grown by the Ammono Method, Materials Science and Engineering B, Elsevier Sequoia, Lausanne, Ch, vol. 50, No. 1-3, Dec. 19, 1997, pp. 46-49.
European Search Report dated Jul. 25, 2017 in Application No. EP 17 16 5792, 12 pages.
F. Yun et al., "Electrical, Structural, and Optical Characterization of Free-Standing GaN Template Grown by Hydride Vapor Phase Epitaxy", Elsevier Science Ltd., Department of Electrical Engineering and Department of Physics, Virginia Commonwealth University, Richmond, VA, Pergamon, Solid-State Electronics, vol. 44, pp. 2225-2232, 2000.
Frayssinet et al., 'Evidence of Free Carrier Concentration Gradient Along the c-Axis for Undoped GaN Single Crystals', Journal of Crystal Growth, vol. 230, 2001, p. 442-447.
Fukuda et al., 'Prospects for the Ammonothermal Growth of Large GaN Crystal', Journal of Crystal Growth, vol. 305, 2007, p. 304-310.
Goepfert et al., "Efficient Acceptor Activation in AlxGa1—xN/GaN doped superlattices" MRS internet J. Nitride Semiconductor Res. 5S1, W3.85, 2000, 6 pages.
Guido Kickelbick et al., "Inorganice Clusters in Organic Polymers and the Use of Polyfunctional Inorganic Compounds as Polymerization Initiators", Monatshefte fur Chemie, vol. 132, pp. 13-30, 2001.
H. Jacobs et al., "High-Pressure Ammonolysis in Solid-State Chemistry", Current Topics in Materials Science, vol. 8, edited by E. Kaldis, North-Holland Publishing Company, Chapter 5, pp. 383-427, 1982.
H. Morkoc, "Comprehensive Characterization of Hydride VPE Grown GaN Layers and Templates", Elsevier Science B.V., Department of Electrical Engineering and Physics Department, Virginia Commonwealth University, Richmond, VA, Materials Science and Engineering, Reports: A Review Journal, vol. R33, pp. 135-207, 2001.
Hanser, A.D. et al., "Growth, Doping and Characterization of Epitaxial Thin Films and Patterned Structures of AIN, GaN, and AlxGa1—xN", Diamond and Related Materials, Elsevier Science Publishers, Amsterdam, NL, vol. 8, No. 2-5, Mar. 1999, pp. 288-294.
Hasewaga, M. et al., "Growth of Nitride Crystals in a Supercritical Nitrogen Fluid Under High Pressures and High Temperatures Yield Using Diamond Anvil Cell and YAG Laser Heating", Journal of Crystal Growth, North Holland Publishing Com. Amsterdam, NL, vol. 217, No., Aug. 8, 2000, pp. 349-354.
Helmut K. Schmidt, "Synthesis and Application of Inorganic/Organic Composite Materials", Macromol. Symp., vol. 101, pp. 333-342, 1996.
I. Grzegory et al., "GaN Crystals: Growth and Doping Under Pressure", Mat. Res. Soc. Symp. Proc, High Pressure Research Center Polish Academy of Sciences, Warsaw, Poland, vol. 482, pp. 15-26, 1998.

J. A. Freitas, Jr., et al., "Structural and Optical Properties of Thick Freestanding GaN Templates", Elsevier Science B.V., Journal of Crystal Growth, vol. 231, pp. 322-328, 2001.
J. I. Pankove, et al., "Molecular Doping of Gallium Nitride", Applied Phys. Lett. 74 (3) 1999, pp. 416-418, American Institute of Physics.
Jeffrey Pyun et al., "Synthesis of Nanocomposite Organic/Inorganic Hybrid Materials Using Controlled/Living Radical Polymerization", American Chemical Society, Chem. Mater., vol. 13, pp. 3436-3448, 2001.
Ketchum et al., "Crystal Growth of Gallium Nitride in Supercritical Ammonia," Journal of Crystal Growth, 2001, vol. 222, pp. 431-434.
Kolis et al., 'Materials Chemistry and Bulk Crystal Growth of Group III Nitrides in Supercritical Ammonia', Material Resources Society Symposium Proceedings, vol. 495, 1998, p. 367-372.
Lucznik et al; "Growth of Bulk GaN Crystals by HVPE on Single Crystalline GaN Seeds", Technology of Gallium Nitride Crystal Growth, Springer Series in Materials Science 133, Chapter 3, pp. 61-77, 2010.
M. Lefeld-Sosnowska et al., "Extended Defects in GaN Single Crystals", Institute of Experimental Physics, University of Warsaw, Poland, Journal of Physics D: Applied Physics, vol. 34, pp. A148-A150, 2001.
M. Leszczynski et al, "Lattice Parameters of Gallium Nitride", High Pressure Research Center, Polish Academy of Sciences, Sokolowska, Warsaw, Poland, American Institute of Physics, Appl. Phys. Lett., vol. 69, No. 1, pp. 73-75, Jul. 1996.
M. Leszczynski, et al., "The Microstructure of Gallium Nitride Monocrystals Grown at Pressure High Pressure", Journal of Crystal Growth 169 (1996) pp. 235-242, High Pressure Research Center, Polish Academy of Sciences, Warsaw, Poland.
Motoki et al., 'Dislocation reduction in GaN crystal by advanced-DEEP', Journal of Crystal Growth, vol. 305, Apr. 1, 2007, pp. 377-383.
Motoki, Kensaku; "Development of Gallium Nitride Substrates", SEI Technical Review, No. 70., Apr. 2010, pp. 28-35.
Myers, et al., "Equilibrium State of Hydrogen in Gallium Nitride: Theory and Experiment", Journal of Applied Physics, American Institute of Physics, New York, NY, vol. 88, No. 8, pp. 4676-4687, 2000.
Oila et al. "Influence of dopants and susbtrate material on the formation of Ga vacancies in epitaxial GaN layers" Phys. Rev. B, vol. 63, p. 045205, 2001.
P. Visconti et al., "Dislocation Density in GaN Determined by Photoelectrochemical and Hot-Wet Etching", American Institute of Physics, Applied Physics Letters, vol. 77, No. 22, pp. 3532-3534, 2000.
P. Visconti et al., "Investigation of Defects and Polarity in GaN Using Hot Wet Etching, Atomic Force and Transmission Electron Microscopy and Convergent Beam Electron Diffraction", Phys. Stat.Sol. vol. (b) 228, No. 2, pp. 513-517, 2001.
Pedro Gomez-Romero, "Hybrid Organic-Inorganic Materials—In Search of Synergic Activity", Advanced Materials, vol. 13, No. 3, pp. 163-174, Feb. 5, 2001.
Pereira, et al., "Local Vibrational Modes of Hydrogen in GaN: Observation and Theory", Physica B. Condensed Matter, Amsterdam, NL, vol. 376-377, pp. 464-467, 2006.
Porowski, 'Near Defect Free GaN Substrates', Journal of Nitride Semiconductor, 1999, pp. 1-11.
R. Dwilinski et al., "GaN synthesis by Ammonothernial Method", Acta Physical Poloncia A., vol. 88, No. 5, pp. 833-836, 1995.
R. Dwilinski et al., "On GaN Crystallization by Ammonothernial Method", Acta Physica Polonica A., vol. 90, No. 4, pp. 763-766, 1996.
R. Dwilinski et al., Ammono Method of GaN and AIN Production,Elsevier Science, Diamond and Related Materials, vol. 7, pp. 1348-1350, 1998.
R. Dwilinski et al., Ammono Method ofBN, AIN and GaN Synthesis and Crystal Growth, MRS Internet Journal Nitride Semiconductor Research 3, Article 25, pp. 1-4, 1998.
R. J. Molnar, "Hydride Vapor Phase Epitaxial Growth of III-V Nitrides", in Gallium Nitride (GaN) II, Semiconductors and Semimet-

(56) References Cited

OTHER PUBLICATIONS als, vol. 57, ed. by J. I. Pankove and T. D. Moustakas (Academic Press, New York, 1999) pp. 1-31.

R. P. Vaudo et al., "GaN Boule Growth: A Pathway to GaN Wafers With Improved Material Quality", Phys. Stat. Sol., vol. (a) 194, No. 2, pp. 494-497, 2002.

Richter et al; "Growth of GaN boules via vertical HVPE", Journal of Crystal Growth, vol. 350, 2012, pp. 89-92.

S. K. Hong et al., "Evaluation of Nanopipes in MOCVD Grown (0001) GaN/Al2O3 by Wet Chemical Etching", Elsevier, Journal of Crystal Growth, vol. 191, pp. 275-278, 1998.

S. K. Mathis et al., "Modeling of Threading Dislocation Reduction in Growing GaN Layers", Phys. Stat. Sol. vol. (a) 179, pp. 125-145, 2000.

S. Krukowski, "Thermodynamics and High-Pressure Growth of (Al, Ga, In)N Single Crystals", Elsevier Science S.A., High Pressure Research Center, Polish Academy of Sciences, Sokolowska, Warsaw, Poland, Diamond and Related Materials, vol. 6, pp. 1515-1523, 1997.

S. Porowoski et al., "High Resitivity GaN Single Crystalline Substrates", Proceedingof the XXVI International School of Semiconducting Compounds, ACTA Physica Polonica A, vol. 92 No. 5 (1997), pp. 958-962, Warsaw Poland.

S. Porowski et al., "GaN Crystals Grown in the Increased Volume High Pressure Reactors", Mat. Res. Soc. Symp. Proc, vol. 449, High Pressure Research Center Polish Academy of Sciences, Warsaw, Poland, pp. 35-40, 1997.

S. Porowski et al., "High Resistivity GaN Single Crystalline Substrates", Proceedings of the XXVI International School of Semiconducting Compounds, Jaszowiec, Warsaw, Poland, ACTA Physica Polonica A, vol. 92, No. 5, pp. 958-962, 1997.

Shmagin et al., "Optical metastability in bulk GaN single crystals" Appl. Phys. lett. vol. 71, 1997, 3 pages.

Sung S. Park et al., "Free-Standing GaN Substrates by Hydride Vapor Phase Epitaxy", Japan Journal of Applied Physics, vol. 39, Part 2, No. 11B, pp. L1141-L1142, Nov. 15, 2000.

T. Hino et al., "Characterization of threading dislocations in GaN Epitaxial Layers" Applied Physics Letters vol. 76, No. 23, pp. 3421-3423 (2000).

T. Paskova et al., "Domain Structure of Thick GaN Layers Grown by Hydride Vapor Phase Epitaxy", MRS Internet J. Nitride Semicond. Res. 4S1, G3.16, 6 pages, 1999.

T. Suski et al., "High Pressure Fabrication and Processing of GaN: Mg", UNIPRESS, High Pressure Research Center, Polish Academy of Sciences, Warszawa, Poland, Elsevier Science S.A., Materials Science and Engineering, vol. B59, pp. 1-5, 1999.

T. Suski et al., "Properties of Bulk Gallium Nitride Crystals", Electrochemical Society Proceedings, UNIPRESS, Polish Academy of Sciences, Sokolowska, Warszawa, Poland, vol. 96-11, pp. 46-57, before Dec. 2002.

Takemoto, et al., "Fabrication of Semi-Insulating GAN Wafers by Hydride Vapor Phase Epitaxy of FE-Doped Thick GAN Layers Using GAAS Starting Substrates", Japanese Journal of Applied Physics, Japan Society of Applied Physics, Tokyo, Japan, vol. 44, No. 50, pp. L1519-L1521, 2005.

V. Dmitriev et al., "Properties of GaN Homoepitaxial Layers Grown on GaN Epitaxial Wafers", Mat. Res. Soc. Symp. Proc, vol. 512, pp. 451-456, 1998.

X. Xu et al., "Growth and Characterization of Low Defect GaN by Hydride Vapor Phase Epitaxy", J. Cryst. Growth 246, pp. 223-249 (2002).

Yole Developpement et al; "CS Substrate Market", Copyright 2010, pp. 102-105, 109, http://www.yole.fr.

Yoshinobu Ono et al., "Reduction of Etch Pit Density on GaN by InGaN-Strained SQW", Elsevier Science B.V., Journal of Crystal Growth, vols. 189/190, pp. 133-137, 1998.

Yu V. Melnik et al., "Structural Properties of GaN Grown on SiC Substrates by Hydride Vapor Phase Epitaxy", Elsevier Science S.A., Diamond and Related Materials, vol. 6, pp. 1532-1535, 1997.

Zhang J-P, et al., "High-Concentration Hydrogen in Unintentionally Doped GaN", Journal of Crystal Growth, Elsevier, Amsterdam, NL, vol. 189-190, pp. 566-569, 1998.

\* cited by examiner

Use Figure 3 from 130575-1

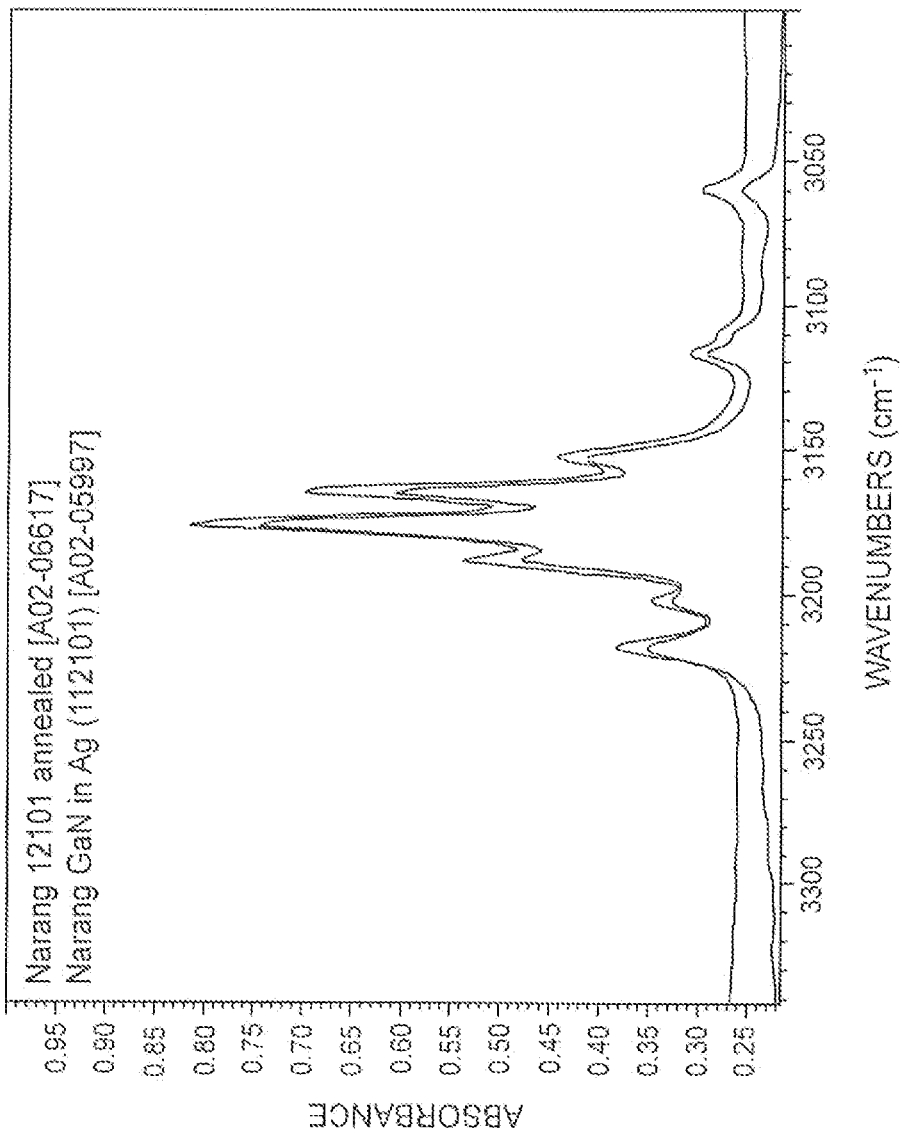

METHOD OF FORMING A GAN SINGLE CRYSTAL COMPRISING DISPOSING A NUCLEATION CENTER IN A FIRST REGION, A GAN SOURCE MATERIAL IN A SECOND REGION, AND ESTABLISHING A TEMPERATURE DISTRIBUTION

CROSS REFERENCE TO RELATED APPLICATIONS

This application is a continuation of application Ser. No. 15/061,069, filed Mar. 4, 2016, now U.S. Pat. No. 10,208,396, issued Feb. 19, 2019, which is a continuation of application Ser. No. 11/558,048, filed on Nov. 9, 2006, now U.S. Pat. No. 9,279,193, issued Mar. 8, 2016, which is a continuation-in-part of application Ser. No. 11/376,575, filed on Mar. 15, 2006, now abandoned, that is a continuation-in-part of application Ser. No. 11/010,507, filed Dec. 13, 2004, now U.S. Pat. No. 7,078,731, issued Jul. 18, 2006, and a continuation-in-part of application Ser. No. 10/329,981, filed Dec. 27, 2002, now U.S. Pat. No. 7,098,487, issued Aug. 29, 2006. This application claims priority to and benefit from the foregoing, the disclosure of which is incorporated herein by reference.

STATEMENT REGARDING FEDERALLY SPONSORED RESEARCH & DEVELOPMENT

The United States Government may have certain rights in this invention pursuant to Cooperative Agreement No. 70NANB9H3020, awarded by the National Institute of Standards and Technology, United States Department of Commerce.

BACKGROUND

Field of Technology

Embodiments relate to a method associated with the crystalline composition.

Discussion of Related Art

Metal nitride based optoelectronic and electronic devices may be commercially useful. It may be desirable to have metal nitrides with relatively lower defect levels. Such defects may include threading dislocations in semiconductor layers of the devices. These threading dislocations may arise from lattice mismatch of the metal nitride layers to a non-homogeneous substrate, such as sapphire or silicon carbide. Defects may arise from thermal expansion mismatch, impurities, and tilt boundaries, depending on the details of the growth method of the layers.

It may be desirable to have a method of making and/or using a metal nitride that differs from those currently available.

BRIEF DESCRIPTION

In one embodiment, a method may include growing onto a substrate a first crystalline composition. The first crystalline composition may include gallium and nitrogen. The crystalline composition may have an infrared absorption peak at about 3175 cm$^{-1}$, with an absorbance per unit thickness of greater than about 0.01 cm$^{-1}$. Or, the first crystalline composition may have an amount of oxygen present in a concentration of less than about $3 \times 10^{18}$ per cubic centimeter, and may be free of two-dimensional planar boundary defects in a determined volume of the first crystalline composition. The first crystalline composition may be removed from the substrate so that the first crystalline composition defines a seed crystal. A second crystalline composition may be grown onto at least one surface of the first crystalline composition.

Embodiments of the invention may include a method of heating a source material that is under pressure and in communication with a nucleation center. The nucleation center may include a first crystalline composition having less than about 5 mole percent of each of phosphorus, arsenic, aluminum, or indium. The first crystalline composition may include at least one grain having a diameter greater than 3 mm, a one-dimensional dislocation density of less than about 1000 per square centimeter, and may be free of two-dimensional defects, such as tilt boundaries. The method may include further growing a second crystalline composition onto the first crystalline composition. In one aspect, the second crystalline composition may include gallium nitride.

In one aspect, the invention also relates to a method forming a crystalline composition comprising gallium nitride, wherein the growth of the crystal is lateral with one embodiment, the lateral growth in the <11-20> direction produces a crystalline composition with large-area (0001) and (000-1) planes. In another embodiment, the lateral growth in the <10-10> direction produces a crystalline composition with large-area (0001) and (000-1) planes; a second embodiment with lateral growth in the <000-1> direction producing a crystalline composition with large-area (10-10) planes; and a third embodiment with lateral growth in the <000-1> direction producing a crystalline composition with large-area (11-20) planes.

BRIEF DESCRIPTION OF THE DRAWINGS

The same reference numbers may be used throughout the drawings to refer to the same or like parts.

FIG. 8 shows the infrared spectrum of an exemplary bulk gallium nitride substrate produced in accordance with an embodiment of the invention.

DETAILED DESCRIPTION

Figure 1:
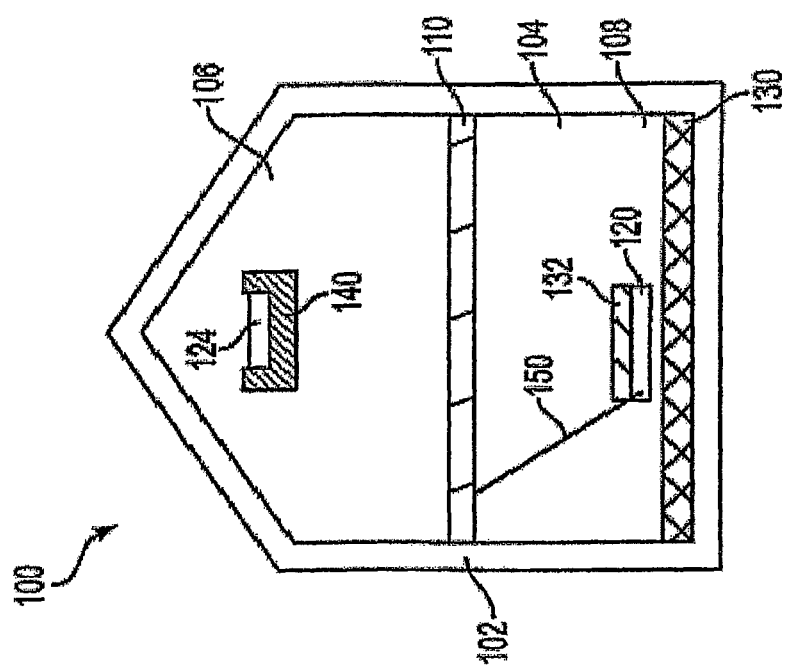
FIG. 1 is a schematic cross-sectional representation of a capsule used for making a gallium nitride crystalline composition according to an embodiment of the invention.

Embodiments may relate to a crystalline composition having determined characteristics. Embodiments may relate to a method associated with making and/or using the crystalline composition. Also provided are one or more wafers formed from the crystalline composition, and an electronic device formed from the wafer.

Approximating language, as used herein throughout the specification and claims, may be applied to modify any quantitative representation that could permissibly vary without resulting in a change in the basic function to which it is related. Accordingly, a value modified by a term such as "about" is not limited to the precise value specified. In some instances, the approximating language may correspond to the precision of an instrument for measuring the value.

Crystalline composition and quasi-crystalline composition may include material where atoms form a uniform periodic array. A quasi-crystalline composition may have a predetermined number of grains per unit area. Crystalline composition defects may be present in each grain, or may be a grain boundary that defines a grain and may be present in an amount of, for example, more than one but less than about 10,000 defects per square centimeter, or in a range of up to about $10^{16}$ defects per cubic centimeter. Polycrystalline material includes a plurality of randomly oriented grains where each grain may include a single crystal, where the plurality of grains are present at more than about $10^{16}$ grain boundaries per cubic centimeter.

Crystalline composition defects refers to one or more of point defects, such as vacancies, interstitials, and impurities; one-dimensional linear defects, such as dislocations (edge, screw, mixed); two-dimensional planar defects, such as tilt boundaries, grain boundaries, cleavage points and surfaces; and three-dimensional extended defects, such as pores, pits, and cracks. Defect may refer to one or more of the foregoing unless context or language indicates that the subject is a particular subset of defect. "Free of two-dimensional defects" may be used interchangeably with "free of tilt boundaries," meaning that the crystalline composition may have tilt boundaries at an insubstantial level, or with a tilt angle such that the tilt boundaries may not be readily detectable by TEM or X-ray diffraction; or, the crystalline composition may include tilt boundaries that are widely separated from one another, e.g., by at least 1 millimeters or by a greater, and specified, distance. Thus, "free" may be used in combination with a term, and may include an insubstantial number or trace amounts while still being considered free of the modified term, and "free" may include further the complete absence of the modified term.

As used herein, the term "group III nitride semiconductor crystals" or "crystalline composition" or "crystalline composition comprising gallium nitride" refers to GaN, AlN, InN, AlGaN, InGaN and their alloys thereof, as represented by $Al_xIn_yGa_{1-x-y}N$, where $0<=x<=1$, $0<=y<=1$ and $0<=x+y<=1$.

As used herein, the term "crystalline composition comprising gallium nitride" may be used interchangeably with "a crystal comprising gallium nitride."

According to embodiments of the invention, a crystalline composition free of two-dimensional defects, such as grain and tilt boundaries, may be synthesized and grown from a single nucleus or from a seed crystal. The crystalline composition has three dimensions as represented by x, y, w characters, with w as the thickness, and x and y the dimensions of the crystal plane perpendicular to w. For a round or circular crystal, x=y=the diameter of the crystalline composition. The grown crystalline composition may have a size of 20 millimeters (mm) or greater in at least one dimension x or y. The crystalline composition may have one or more grains, and the grains may have determined characteristics or attributes as disclosed herein.

In one embodiment, the crystalline composition may be n-type, electrically conductive, opaque, free of lateral strain and free of two-dimensional planar boundary defects, and may have a one-dimensional linear dislocation density of less than about 10,000 $cm^{-2}$. In one embodiment, the dislocation density may be less than about 1000 $cm^{-2}$, or less than about 100 $cm^{-2}$. The two-dimensional planar boundary defects may include, for example, tilt boundaries.

In one embodiment, the crystalline composition may be p-type; in another, it may be semi-insulating. With reference to the p-type material, the crystalline composition may function as a p-type semiconductor at about room temperature, at a temperature in a range of less than about 300 Kelvin (K), in a range of from about 300 K to about 250 K, less than about 250 K, in a range of from about 250 K to about 100 K, or less than about 100 K. In one embodiment, the crystalline composition may be magnetic, may be luminescent, or may be both. The crystalline composition may be one or more of opaque, optically absorbing, and/or black. In one embodiment, an opaque crystalline composition may be an undoped crystalline composition; particularly, the opaque crystalline composition may be free of magnesium. Black, as used herein, is specifically distinguished from dark grey, dark blue, dark brown, or other color and has no predominant hue.

In one embodiment, the crystalline composition may include hydrogen in a form that results in an infrared absorption peak near 3175 $cm^{-1}$, with an absorbance per unit thickness greater than about 0.01 $cm^{-1}$.

The crystalline composition may contain up to about 5 mole percent boron, aluminum, indium, phosphorus, and/or arsenic. In one embodiment, the crystalline composition may contain boron, aluminum, indium, phosphorus, and/or arsenic in an amount in a range of from about 0.1 mole percent to about 0.25 mole percent, from about 0.25 mole percent to about 1 mole percent, from about 1 mole percent to about 2 mole percent, or from about 2 mole percent to about 5 mole percent. In one embodiment, the crystalline composition may be essentially free of boron. In one embodiment, the crystalline composition may be essentially free of aluminum. In one embodiment, the crystalline composition may be essentially free of indium. In one embodiment, the crystalline composition may be essentially free of phosphorus. In one embodiment, the crystalline composition may be essentially free of arsenic. In one embodiment, the crystalline composition may be essentially free of another group V element. In one embodiment, the crystalline composition may be gallium nitride and may be essentially free of another group III metal, apart from gallium.

In one embodiment, the crystalline composition may be doped with at least one of Be, C, O, Mg, Si, H, Ca, Sc, Ti, V, Cr, Mn, Fe, Co, Ni, Cu, Zn, Ge, Zr, or Hf. In one embodiment, the crystalline composition may be doped with at least one rare earth metal. If present, the dopant may be at a concentration in a range of up to about $10^{16}$ cm$^{-3}$, from about $10^{16}$ cm$^{-3}$ to about $10^{21}$ cm$^{-3}$, or greater.

A relatively large gallium nitride crystalline composition may be grown by temperature gradient recrystallization at high-pressure and high temperature in a superheated fluid solvent. The crystalline composition may be a true single crystal, i.e., it does not have any grain boundaries whatsoever. Other crystalline compositions in accordance with an embodiment of the invention may be free of tilt boundaries, that is, they may have an insubstantial number of tilt boundaries, or may have no tilt boundaries whatsoever.

These gallium nitride crystalline compositions may be grown by temperature-gradient recrystallization in a superheated fluid or a supercritical fluid. A suitable fluid may be nitrogen-containing and may include one or more of ammonia, hydrazine, triazine, methylamine, ethylenediamine, melamine, or another nitrogen-containing material. In one embodiment, the nitrogen-containing fluid consists essentially of ammonia.

The source material may include gallium and nitrogen, which may be in the form of, for example, gallium nitride crystalline powder. Other forms of source material may be used, for example, single crystal or polycrystalline AlN, amorphous gallium nitride or a gallium nitride precursor such as gallium metal or a gallium compound. Single crystal or polycrystalline AlN can be grown by a number of methods known in the art. Other forms of AlN can also be used, for example, amorphous AlN or an AlN precursor such as Al metal or an Al compound. In embodiments with a temperature gradient, it may be that the source material may include one or more particles that may be sufficiently large in size so as not to pass through the openings in a baffle, described below, that separates the source region, where the source material may be located, from the crystalline composition growth region, where a nucleation center may be located, of a chamber or capsule, as discussed in more detail below. In one embodiment for the growth of non-GaN nitrides, the oxide content of the source material is kept at less than about 1 weight percent.

Nucleation for gallium nitride growth may be induced on a growth portion of the capsule at a nucleation center without a seed crystal, such as a portion of the container wall. Alternatively, a seed crystal may be used.

Suitable seed crystals may be GaN-based, or may be non-GaN-based. A seed crystal formed entirely from the same nitride may be used for ease of control and because the quality of the grown crystalline composition may be relatively higher. In one embodiment for the growth of AlN, nucleation can be induced on the crystal growth portion of the cell with a non-AlN seed crystal such as silicon carbide, but the process is easier to control if an AlN seed crystal is provided. Suitable GaN-based seed crystals may include a free-standing gallium nitride film grown by at least one of HVPE, sublimation, or metal organic chemical vapor deposition (MOCVD), or by a crystalline composition grown in a superheated fluid in a previous run. A variety of types of AlN seed crystals may be used for growing AlN, including an epitaxial AlN layer on a non-AlN substrate such as sapphire or SiC, a free-standing AlN film grown by HVPE or MOCVD, an AlN crystal grown by sublimation/recondensation, or a crystal grown in a supercritical fluid in a previous run.

If a seed crystal that is not entirely formed from gallium nitride is not used, a suitable non-GaN seed crystal may include sapphire or silicon carbide. In one embodiment, the non-GaN-based seed crystal may be pre-coated with a layer of gallium nitride on a growth surface. Suitable coated seed crystals may include an epitaxial gallium nitride layer on a non-GaN substrate. Whether GaN-based or non-GaN-based, the seed crystal may include an amount of fluorine greater than about 0.04 ppm, or in a range of from about 0.04 to about 1 ppm fluorine. The seed crystal may include an amount of chlorine greater than about 0.04 ppm, or in a range of from about 0.04 to about 1 ppm chlorine. In one embodiment, the seed crystal is essentially halogen-free.

The seed crystal may be larger than 1 millimeter in at least one dimension x or y and of high quality being free of tilt boundaries and having a dislocation density in a range of less than about $10^8$ cm$^{-2}$. In one embodiment, the seed crystal may have a dislocation density in a range of less than about $10^5$ cm$^{-2}$. The character and attributes of the seed crystal may directly impact the character and attributes of the crystalline composition grown thereon.

The seed may have any crystallographic orientation, as growth may occur on all exposed gallium nitride surfaces. Gallium nitride crystalline compositions grown from seeds may terminate predominantly by (0001), (000$\bar{1}$), and (1$\bar{1}$00) facets, and all these orientations may be suitable for seed surfaces. The (11$\bar{2}$0) surfaces may be fast growing in the inventive method, and also constitute favorable seed surface orientations. In one embodiment, the crystallographic orientation of the gallium nitride crystalline compositions that may be grown may be within about 10° of one of the (0001) orientation, the (000$\bar{1}$) orientation, the (10$\bar{1}$0) orientation, the (11$\bar{2}$0) orientation, and the (10$\bar{1}$1) orientation. In one embodiment, the orientation of the grown gallium nitride crystalline compositions may be within about 5° of one of these orientations. A standard metric for the crystallinity of as-grown gallium nitride crystalline compositions or of gallium nitride wafers may be provided by x-ray diffraction rocking curve measurements of the (0002) reflection. The full width at half maximum (FWHM) of the (0002) diffraction intensity versus ω of gallium nitride crystalline compositions and wafers of the inventive method may be less than about 50 arc-seconds, less than about 30 arc-seconds, less than about 20 arc-seconds, or less than 15 arc-seconds.

With reference to the seed crystals, the seed crystals may have a dislocation density below $10^4$ cm$^{-2}$ and may be free of tilt boundaries. The use of low-defect seed crystals may result in a grown crystalline composition that similarly has a relatively low dislocation density and relatively low density of other types of defects. In one embodiment, the gallium nitride seed crystals contain one or more tilt boundaries, even if no grain boundaries are present. In one embodiment, the nature and character of the seed crystal affects and controls the nature and character of a crystal grown on a surface of the seed crystal.

A gallium nitride crystalline composition with a one-dimensional dislocation density that is less than about $10^4$ cm$^{-2}$ and that is free from two-dimensional defects, such as tilt boundaries, may be grown from seed crystals with a dislocation density in a range of from about $10^5$ cm$^{-2}$ to about $10^8$ cm$^{-2}$ and that is free from two-dimensional defects, such as tilt boundaries, by the following procedure:

By suitable control of the source material, solvent fill, mineralizer concentration, temperature, and temperature gradient, growth on the seed may occur in both the c direction (that is, <0001> and <000$\bar{1}$>, along the c-axis) and perpendicular to the c direction. The dislocation density 410 in bulk gallium nitride grown in the c-direction may be reduced significantly. For example, growth of a 300-800 μm thick layer above a c-oriented seed crystal 402 containing approximately $10^7$ dislocations $cm^{-2}$ results in a gallium nitride crystalline composition with approximately $1-3\times10^6$ dislocations $cm^{-2}$ in the region above the seed 404, as shown in FIG. 4.

Figure 4:
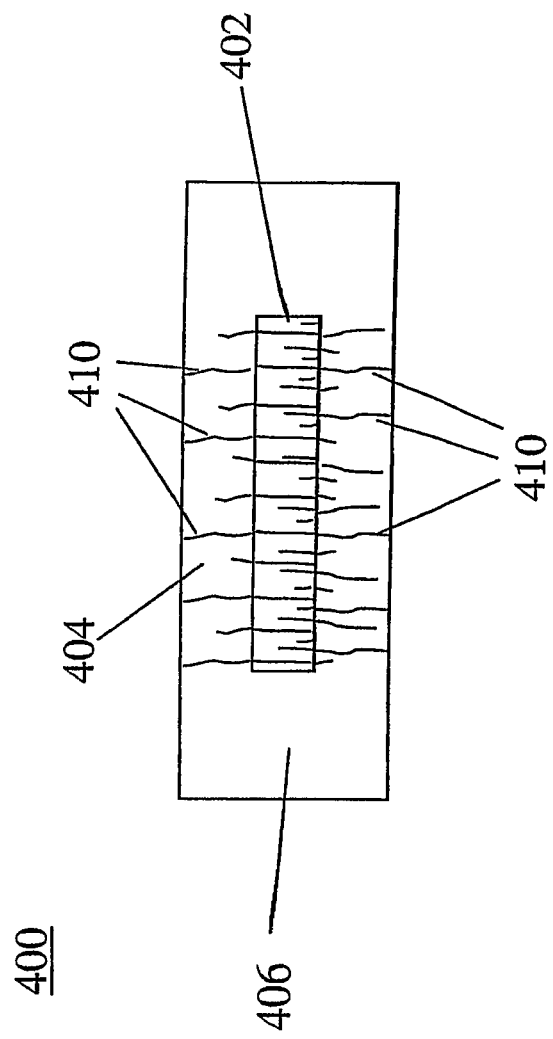
FIG. 4 is a schematic illustration of the evolution of dislocations in bulk gallium nitride grown on a c-oriented seed crystal containing dislocations.
Figure 5:
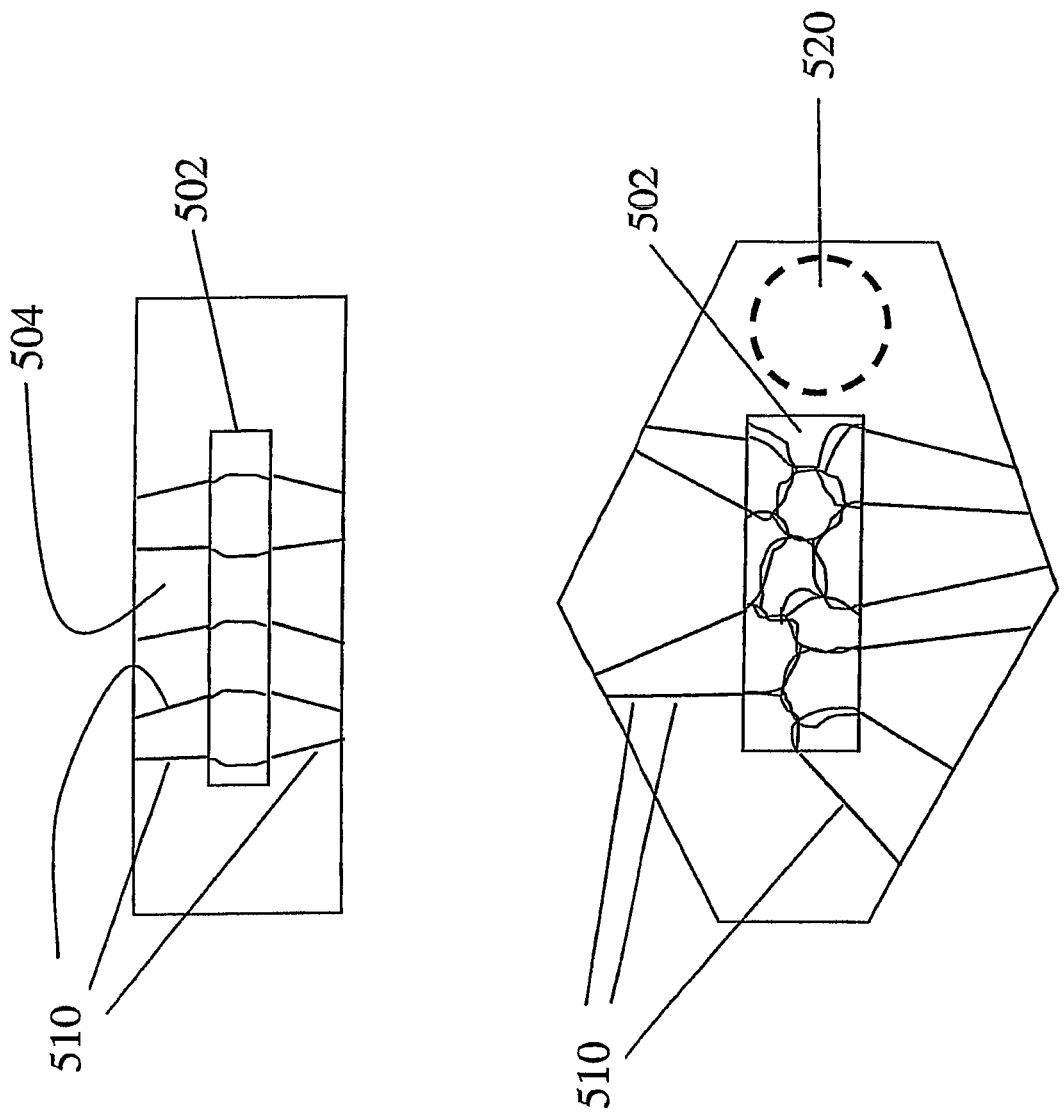
FIG. 5 is a schematic illustration of the evolution of tilt boundaries in bulk gallium nitride grown on a c-oriented seed crystal containing tilt boundaries.

However, the bulk gallium nitride grown laterally 406 with respect to a c-oriented seed crystal 402 has fewer than $10^4$ dislocations $cm^{-2}$, fewer than $10^3$ dislocations $cm^{-2}$, and even more fewer than 100 dislocations $cm^{-2}$, as illustrated in FIG. 4. Tilt boundaries 510 that may be present in a c-oriented seed crystal 502 may propagate during growth in the c direction, resulting in a grain structure in bulk gallium nitride grown above 504 the seed that may be similar to that in the seed 502, as illustrated schematically in FIG. 5. However, tilt boundaries 510 may radiate outward in bulk gallium nitride that may be grown laterally, for example, by growth in the m-direction or in the a-direction, resulting in progressively larger domains 520 that may be free of tilt boundaries 510 as the crystalline composition becomes larger, as illustrated in FIG. 5. The position of the tilt boundaries 510 may be determined by x-ray diffraction, x-ray topography, or simple optical reflection, and a new seed crystal may be cut from the laterally-grown gallium nitride that may be entirely free of tilt boundaries. Bulk gallium nitride grown from this new seed crystal may be free of tilt boundaries and may have a dislocation density below $10^4$ $cm^{-2}$, below $10^3$ $cm^{-2}$, and even more below 100 $cm^{-2}$. While this discussion assumes a c-oriented seed crystal, seed crystals of other orientations may be employed, such as within about 10° of one of the (0001) orientation, the (000$\bar{1}$) orientation, the (10$\bar{1}$0) orientation, the (11$\bar{2}$0) orientation, and the (10$\bar{1}$1) orientation. The dislocation density similarly may be reduced by lateral growth from the original seed crystal and tilt boundaries may radiate outward, enabling seed crystals that may be free of tilt boundaries and may have a dislocation density below $10^4$ $cm^{-2}$, below $10^3$ $cm^{-2}$, or, in one embodiment, below 100 $cm^{-2}$.

Figure 6:
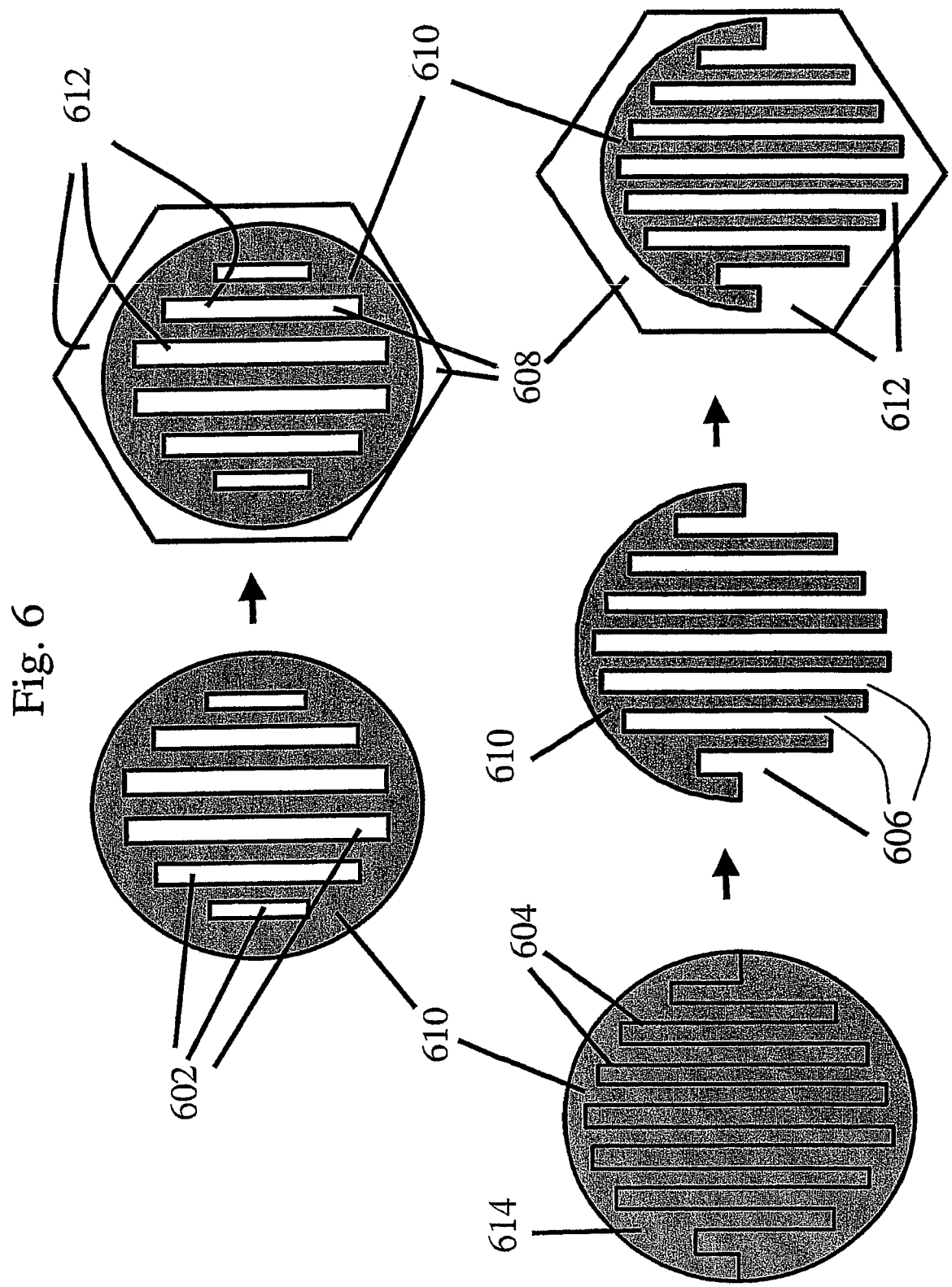
FIG. 6 is a schematic illustration of gallium nitride seeds with cutouts enabling growth of large areas of low-dislocation-density crystalline compositions even with defective seeds.

Relatively large areas of gallium nitride with a one-dimensional linear dislocation density below $10^4$ $cm^{-2}$, below $10^3$ $cm^{-2}$, and even more below 100 $cm^{-2}$ may be prepared using seeds with higher dislocation densities by the following procedure. Holes, cutouts, or zigzag patterns may be placed in the seeds by means of cutting by a laser, for example. Examples of such seeds 610 may be shown in FIG. 6. The holes, cutouts, or other patterns may be round, elliptical, square, or rectangular, for example. In one embodiment, shown in FIG. 6, the long dimensions of slots 602 or zigzag cuts 604 may be oriented approximately parallel to (10$\bar{1}$0) (m plane). In this orientation a steady growth front may occur, filling in the slot 602 or space 606 smoothly. In this way lateral growth 612 can take place in the central portion of a crystalline composition rather than just at the periphery, producing large domains 608 of very low dislocation density, below $10^4$ $cm^{-2}$, material even when using seeds with a relatively high dislocation density, above $10^6$ $cm^{-2}$. This process may be repeated. A crystalline composition grown by the method described above may contain regions of moderately low and very low dislocation densities. Regions of the crystalline composition with higher dislocation densities may be cut out and the crystalline composition used again as a seed. Lateral growth 612 may again fill in the cut out 602 areas with very low dislocation density material 608. In this way large area gallium nitride crystalline compositions can be produced that have dislocation densities less than $10^4$ $cm^{-2}$, and less than 100 $cm^{-2}$ over greater than 80 percent of their area. These crystalline compositions may contain tilt boundaries at the regions of coalescence in the laterally-grown material, but the separation between the tilt boundaries can be made larger than about 2 millimeters (mm), 2.75 mm, 3 mm, 5 mm, 10 mm, 18 mm, 25 mm, or greater than 25 mm.

By these lateral growth methods, either along the periphery of a seed crystal or with a patterned seed crystal, it may be possible to produce crystalline compositions with grain boundaries spaced 2 millimeters apart, or greater. In one embodiment, at least one dimension x or y of the single crystal grain may be in a range of from about 2 mm to about 2.75 mm, from about 2.75 to about 3 mm, from about 3 mm to about 5 mm, from about 5 mm to about 10 mm, from about 10 mm to about 25 mm, of from 25 mm to 600 millimeters in at least one dimension x or y. Use of a wafer sliced from such a crystalline composition as a substrate enables fabrication of large-area homoepitaxial gallium nitride-based electronic or optoelectronic devices that may be free of tilt boundaries.

With reference to the thickness of the crystalline composition grown in accordance with an embodiment of the invention, the thickness may be greater than about 100 micrometers. In one embodiment, the thickness may be in a range of from about 100 micrometers to about 0.3 mm, from about 0.3 mm to about 1 mm, from about 1 mm to about 1.5 mm, from about 1.5 mm to about 10 mm, or greater than about 10 millimeters.

The source material and one or more seeds, if used, may be placed in a pressure vessel or capsule that may be divided into at least two regions by means of a porous baffle.

FIG. 1 illustrates an exemplary capsule 100. The capsule 100 includes a wall 102, which can be sealed to surround a chamber 104 of the capsule 100. The chamber may be divided into a first region 108 and a second region 106 separated by a porous baffle 110. During crystallization growth the capsule 100 may include a seed crystal 120 or other nucleation center and a source material 124 separated from each other by the baffle 110. The source material 124 and the seed crystal 120 may be positioned in the second region 106 and the first region 108, respectively, for example. The capsule 100 also may include a solvent material 130. During the growth process, described below, a grown crystalline composition 132 may be grown on the seed crystal 120 and the solvent may be in a superheated state.

The baffle 110 may include, for example, a plate with a plurality of holes in it, or a woven metal cloth. The fractional open area of the baffle 110 may be in a range of from about 1 percent to about 50 percent, from about 2 percent to about 10 percent, from about 1 percent to about 2 percent, or from about 10 percent to about 50 percent. Transport of nutrient from the source material 124 to the seed crystal 120 or grown crystalline composition 132 may be optimized in the solvent as a superheated fluid if the colder portion of the capsule 100 may be above the warmer portion, so that self-convection stirs the fluid. In some solvents, the solubility of gallium nitride may increase with an increase in temperature. If such a solvent is used, the source material 124 may be placed in the lower and warmer portion of the capsule and the seed crystal 120 may be placed in the upper or colder portion of the capsule.

The seed crystal 120 may be hung, for example, by a wire 150 fastened through a hole drilled through the seed, so as to allow crystalline composition growth in all directions with a minimum of interference from wall 102, wire 150, or other materials. A suitable hole may be formed by a laser, or by a diamond drill, an abrasive drill, or an ultrasonic drill. The seed crystal 120 may be hung by tying a wire around an end of the seed.

In the case of some solvents, however, the solubility of gallium nitride may decrease with an increase in temperature. If such a solvent is used, the seed crystal 120 may be placed in the lower and warmer portion of the capsule and the source material 124 may be placed in the upper and colder portion of the capsule. The source material 124 may be placed in a porous basket 140 displaced from the baffle 110 rather than immediately contacting the baffle 110, as the latter arrangement may impede transport of fluid and nutrient through the baffle 110.

A mineralizer may be added to the capsule 100, in order to increase the solubility of gallium nitride in the solvent, either together with the source material 124 or separately. The mineralizer may include at least one of (i) nitrides, such as alkali and alkaline-earth nitrides, and particularly $Li_3N$, $Mg_3N_2$, or $Ca_3N_2$; (ii) amides, such as such as alkali and alkaline-earth amides, and particularly $LiNH_2$, $NaNH_2$, and $KNH_2$; (iii) urea and related compounds, such as metal urea complexes; (iv) nitrogen halides, such as ammonium salts, and particularly $NH_4F$ and $NH_4Cl$; (v) rare earth halides, rare earth sulfides, or rare earth nitrate salts, such as $CeCl_3$, NaCl, $Li_2S$, or $KNO_3$; (vi) azide salts, such as alkaline azides, and particularly $NaN_3$; (vii) other Li salts; (viii) combinations of two or more of the above; (ix) organic derivatives of one or more of the above, such as alkylammonium halide, particularly triphenylphosphonium chloride; or (x) compounds formed by chemical reaction of at least one of the above with gallium and/or gallium nitride. In one embodiment, the mineralizer is an acidic mineralizer, and may be entirely free of a basic mineralizer. An acidic mineralizer may produce a hydronium ion under process conditions.

In one embodiment, ammonia may be employed as the superheated fluid solvent and at least one of hydrogen halide, ammonium halide, gallium halide, gallium tri halide, or a compound produced by chemical reactions between the halides and one or more of ammonia ($NH_3$), gallium, or gallium nitride may be employed as the mineralizer. Suitable halides may include fluorine, chlorine, or a combination of fluorine and chlorine.

The combination with a mineralizer may provide a relatively high solubility of gallium nitride while not being overly corrosive to the capsule, particularly when the capsule may include silver. In this case the effective solubility of gallium nitride may decrease with temperature. The gallium nitride may undergo a chemical reaction with the mineralizer and solvent to form a complex including gallium halide, ammonium ions, and ammonia, and the complex may be soluble in superheated fluid, such as ammonia. A suitable complex may include gallium fluoride. Formation of the complexes may be reversible, with an equilibrium constant for formation that decreases with temperature so that formation of free gallium nitride may be favored at higher temperature and the effective solubility of gallium nitride decreases with temperature. After ending a crystalline composition growth run with this chemistry, the capsule may be filled with white needle-shaped crystals. X-ray diffraction analysis indicates that the crystalline compositions may include $GaF_3(NH_3)_2$ and $(NH_4)_3GaF_6$, whose structures may be known from the literature.

In another embodiment, ammonia may be employed as the superheated fluid solvent and at least one of hydrogen chloride, ammonium chloride, gallium chloride, gallium trichloride, or a compound produced by chemical reactions between HCl, $NH_3$, Ga, and gallium nitride, may be employed as the mineralizer. In this case the effective solubility of gallium nitride may increase with temperature.

Optionally, a dopant source may be also added to provide a determined type of crystalline composition. Examples of such determined types may include n-type, semi-insulating, p-type, magnetic, luminescent, or optically absorbing gallium nitride crystals. Dopants may be added to modify the bandgap. Adventitious impurities such as oxygen or carbon may otherwise normally render the crystalline compositions n-type. Dopants such as oxygen, silicon, beryllium, magnesium, Ge (n-type), or Zn (p-type), may be added to the source gallium and/or nitrogen. Alternatively, the dopants may be added as metals, salts, or inorganic compounds, such as Si, $Si_3N_4$, InN, $SiCl_4$, $AlCl_3$, $InCl_3$, $BeF_2$, $Mg_3N_2$, $MgF_2$, $PCl_3$, Zn, $ZnF_2$, or $Zn_3N_2$. Aluminum, arsenic, boron, indium, and/or phosphorus may be present at levels up to about 5 mole percent, where the amount is calculated either individually or collectively. Such additions may have the effect of increasing or decreasing the bandgap with respect to pure gallium nitride. Such doped crystalline compositions may be referred to herein as gallium nitride, even though they may contain significant levels of another material. Gallium nitride crystalline compositions with total dopant concentrations below about $10^{15}$ $cm^{-3}$ to about $10^{16}$ $cm^{-3}$ may be semi-insulating. However, the concentration of unintentional impurities may be higher than $10^{16}$ $cm^{-3}$ and the crystalline compositions may be n-type. Semi-insulating gallium nitride crystalline compositions may be obtained by doping with at least one of Sc, Ti, V, Cr, Mn, Fe, Co, Ni, or Cu. In one embodiment, semi-insulating gallium nitride crystalline compositions may be produced by doping with one or both of iron or cobalt.

Magnetic gallium nitride crystalline compositions may be obtained by doping with certain transition metals, such as, but not limited to, manganese. Luminescent gallium nitride crystalline compositions may be obtained by doping with one or more transition metals or with one or more rare-earth metals. Suitable luminescent dopants may include one or more of Ti, V, Cr, Mn, Fe, Co, Ni, Zr, Hf, Pr, Eu, Er, or Tm. The transition-metal or rare-earth dopants may be additives in the source material, or as elemental metal, metal salts, or inorganic compounds. In one embodiment, the additives may include one or more of Fe, Co, $CoF_2$, CrN, or $EuF_3$, either alone or in combination with one or more additional dopants, such as O, Si, Mg, Zn, C, or H. Such additives may be present in concentrations in a range of from about $10^{15}$ $cm^{-3}$ to about $10^{21}$ $cm^{-3}$ in the source material. Depending on the identity and concentration of the additive, the crystalline composition may be opaque or may be optically absorbing; e.g., black. For example, heavily Co-doped gallium nitride crystalline compositions may be black in color and may produce no visible photoluminescence in response to irradiation with a nitrogen laser.

In one embodiment, the impurity levels in the raw materials (source material, mineralizer, and solvent) and capsules may be limited to appropriately low levels to keep the concentration of undesired dopants, such as oxygen, to an acceptable level. For example, an oxygen concentration below $3\times10^{18}$ $cm^{-3}$ in the grown crystalline compositions may be achieved by holding the total oxygen content in the raw materials and capsule below 15 parts per million, with respect to the weight of the final crystal, and an impurity level below $3\times10^{17}$ $cm^{-3}$ may be achieved by holding the total oxygen content in the raw materials and capsule below 1.5 parts per million.

The presence of oxygen in the system (raw materials, vessel) may be deleterious to the ammonothermal growth of nitrides under some circumstances. Oxygen contents above $10^{18}$ cm$^3$, above $10^{19}$ cm$^{-3}$, and even above $10^{20}$ cm$^{-3}$ have been observed in some ammonothermally-grown GaN. In one embodiment of the invention, it is noted that the role of oxygen is more deleterious in the case of growth of both AlN and InN than it is with GaN. From the free energy of formation of pure substances, the ease with which ammonia may reduce the group III metal nitride may be illustrated in Table I below. Data is from I. Barin, with a correction for the enthalpy of formation of GaN [Ranade et al., J. Phys. Chem. B 104, 4060 (2000)].

TABLE 1

Free energies of reaction $\Delta G°$ for selected oxide-reduction reactions (kJ/mol).

| T (K) | $Al_2O_3 + 2NH_3 = 2AlN + 3H_2O$ | $Ga_2O_3 + 2NH_3 = 2GaN + 3H_2O$ | $In_2O_3 + 2NH_3 = 2InN + 3H_2O$ |
| --- | --- | --- | --- |
| 800 | 269 | 16 | 127 |
| 900 | 252 | 1 | 111 |
| 1000 | 236 | −14 | 96 |
| 1100 | 219 | −29 | 80 |

As illustrated, at temperatures of approximately 900 K and above, ammonia can readily reduce gallium oxide to gallium nitride in qualitative agreement with the observation that GaN may be grown ammonothermally even when large quantities of oxygen or oxide are present in the raw materials. However, ammonia does not readily reduce either aluminum oxide or indium oxide at any of these temperatures, which is surprising in the sense that the thermodynamics of a given reaction type may vary monotonically as one passes down a column in the Periodic Table (Al—Ga—In). Accordingly, desired results may be obtained based on the oxygen content of the raw materials, which may be less than 1%. Even further, the results may differ when the oxygen content is less than 0.1%, less than 0.01%, less than 0.001% (10 ppm), or less than 1 ppm.

In one embodiment, in order to reduce the concentration of undesired dopants, such as oxygen, to an acceptable level, one or more getters may be also added to the capsule. For non-fluoride mineralizers, such as $NH_4Cl$, suitable getters include alkaline earth metals, Sc, Ti, V, Cr, Y, Zr, Nb, Hf, Ta, W, rare earth metals, and their nitrides or halides. When $NH_4F$, HF, $GaF_3$ (or their chlorine equivalents) and/or their reaction products with $NH_3$, gallium, and gallium nitride, may be used as mineralizers, also referred to herein as acid mineralizers, highly reactive metals may tend to form metal halide, which may be unreactive with water or oxygen in the system. However, compounds of metals may have the property that the free energy of reaction of the metal fluoride with water to form the metal oxide and HF may be more negative under crystalline composition growth conditions than the corresponding reaction of $GaF_3$ with water may be used as getters. Suitable getters for use with acid fluoride mineralizers include $CrF_3$, $ZrF_4$, $HfF_4$, $VF_4$, $NbF_5$, $TaF_5$, and $WF_6$.

The capsule 100 may be filled with a solvent 130 that may include a superheated fluid under processing conditions, such as, for example, ammonia, hydrazine, methylamine, ethylenediamine, melamine, or other nitrogen-containing fluid. In one embodiment ammonia may be employed as the solvent 130. Of the free volume in the capsule, i.e., the volume not occupied by the source material, seed(s), and baffle), between 25 percent and 100 percent, or between 70 percent and 95 percent, may be filled with solvent 130 and the capsule 100 may be sealed.

Depending upon the concentration of the mineralizer dissolved into the superheated fluid solvent, under crystalline composition growth conditions the superheated fluid solution may be either supercritical or may be subcritical. For example, ammonia has a critical temperature and pressure of 132 degrees Celsius and 113 bar, respectively. The corresponding quantities for $NH_4F$ may be expected to be similar to the values for $NH_4Cl$, which may be about 882 degrees Celsius and 1635 bar. A solution of $NH_4F$ in ammonia may be expected to have a critical point at a temperature and pressure intermediate between the critical temperatures and pressures of the constituents $NH_4F$ and ammonia. The presence of gallium-containing complexes in the solution may further modify the equation of state and critical point of the superheated fluid.

In one embodiment, the mineralizer may be present at a concentration between 0.5 and 5 mole percent with respect to the solvent. Acid mineralizers, for example, $NH_4F$ and $NH_4Cl$, may differ in effectiveness based on the concentration. Differing effects may be observed at concentrations above any one of 0.5 mole percent, 1 mole percent, 2 mole percent, 5 mole percent, 10 mole percent, 20 mole percent, 50 mole percent, or more in ammonia. In the case of $NH_4F$, the concentration of dissolved gallium nitride, that is, the concentration of gallium present in complexes that may be believed to be dissolved under crystalline composition growth conditions, may be approximately proportional to the mineralizer concentration at values at least as high as 25 mole percent, and that gallium nitride crystalline composition growth may be very effective under these conditions. The use of mineralizer concentrations above 20 mole percent in ammonia has the added benefit of reducing the pressure of the solvent at a given fill level, thereby reducing the mechanical demands on the pressure vessel.

The capsule 100 may be cooled to a temperature at which the solvent 130 may be either a liquid or solid. Once the capsule 100 may be sufficiently cooled, a solvent source may be placed in fluid communication with the open chamber of the capsule 100 and solvent may be introduced into the chamber, which may be open at this point, by either condensation or injection. After a desired amount of solvent 130 may be introduced into the open chamber, the chamber may be sealed. Pinching off or collapsing a portion of the wall 102 to form a weld may seal the chamber.

The sealed capsule 100 may be placed in a vessel capable of generating temperatures in a range of greater than about 550 degrees Celsius. The temperature may be in a range of from about 550 degrees Celsius to about 650 degrees Celsius, from about 650 degrees Celsius to about 750 degrees Celsius, from about 750 degrees Celsius to about 900 degrees Celsius or greater than about 900 degrees Celsius. The pressure may be in a range of from about 5 kbar to about 10 kbar, from about 10 kbar to about 15 kbar, from about 15 kbar to about 20 kbar, from about 20 kbar to about 50 kbar, or greater than about 50 kbar. The capsule may be formed from materials, and structurally designed, to be capable of functioning at the elevated temperature and pressure, while filled with the raw materials, for a determined length of time. Capsules that are capable of receiving the raw materials, but are unable to remain sealed during process conditions are not suitable. Likewise, capsules that are formed from, or lined with, material that negatively impact the reaction product to a determined degree are not suitable for use in some embodiments.

Figure 2:
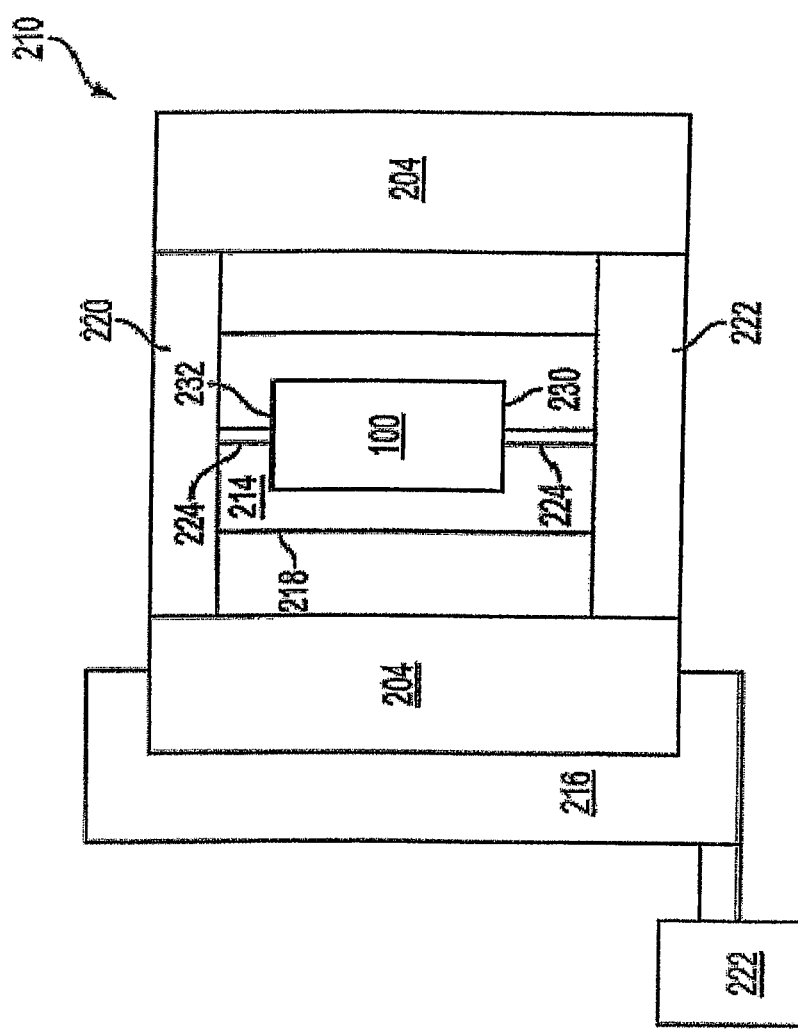
FIG. 2 is a schematic cross-sectional representation of a pressure vessel used for making a gallium nitride crystalline composition according to an embodiment of the invention.

FIG. 2 illustrates a pressure vessel 210 housing the enclosed capsule 100. The pressure vessel 210 illustrated in FIG. 2 may include a hydraulic press with a die.

The pressure vessel 210 may include a pressure medium 214 enclosed by compression die 204 and top and bottom seals 220 and 222. The pressure medium may be, for example, NaCl, NaBr or NaF.

The pressure vessel 210 includes a wattage control system 216 for controlling the heating of the capsule 100. The wattage control system 216 includes a heating element 218 to provide heating to the capsule 100, and a controller 222 for controlling the heating element 218. The wattage control system 216 also includes at least one temperature sensor 224 proximate to the capsule 100 for generating temperature signals associated with the capsule 100.

The pressure vessel 210 may be arranged to provide a temperature distribution, i.e., the temperature as a function of the position within the capsule chamber, within the capsule chamber, including a temperature gradient within the capsule 100. In one embodiment, the temperature gradient may be achieved by placing the capsule 100 closer to one end of the cell (the region within the pressure vessel 210) than the other. Alternatively, providing at least one heating element 218 having a non-uniform resistance along its length may produce the temperature gradient.

Non-uniform resistance of the at least one heating element 218 may be provided, for example, by providing at least one heating element 218 having a non-uniform thickness, by perforating the at least one heating element 218 at selected points, or by providing at least one heating element 218 that includes a laminate of at least two materials of differing resistivity at selected points along the length of the at least one heating element 218. In one embodiment, the at least one temperature sensor 224 includes at least two independent temperature sensors provided to measure and control the temperature gradient between the opposite ends 230, 232 of the capsule 100. In one embodiment, closed-loop temperature control may be provided for at least two locations within the cell. The at least one heating element 218 may also include multiple zones which may be individually powered to achieve the desired temperature gradient between two ends of the capsule 100.

The capsule 100 may be heated to one or more growth temperatures. The growth temperatures may be in a range of greater than about 550 degrees Celsius. The temperature may be in a range of from about 550 degrees Celsius to about 650 degrees Celsius, from about 650 degrees Celsius to about 750 degrees Celsius, from about 750 degrees Celsius to about 900 degrees Celsius, or greater than about 900 degrees Celsius. The heating may be performed at an average ramp rate in a range of from about 1 degrees Celsius/hr to about 1000 degrees Celsius/hr. A temperature gradient may be present in the capsule, due to asymmetric placement of the capsule in the cell, non-symmetric heating, or the like, as described above with respect to the pressure cell 210. This temperature gradient may create supersaturation throughout the heating sequence, and may promote spontaneous nucleation.

In one embodiment, the temperature gradient at the growth temperature may be initially held small, less than about 25 degrees Celsius and less than about 10 degrees Celsius, for a period in a range of from about 1 minute and 2 hours, in order to allow the system to equilibrate in an equilibrium stage. The temperature gradient as used in this application may be the difference in the temperature at the ends of the capsule, for example, where the control thermocouples may be located. The temperature gradient at the position of the seed crystal 120 or nucleation center with respect to the temperature at the position of the source material 124 may be likely to be somewhat smaller.

Optionally, the temperature gradient may be set in the equilibrium stage to be opposite in sign to that where crystalline composition growth occurs on the nucleation center (i.e., so that etching occurs at the nucleation center and growth occurs on the source material) so as to etch away any spontaneously-nucleated crystalline compositions in the region of the capsule where the nucleation center may be provided that may have formed during heating. In other words, if the crystalline composition growth occurs for a positive temperature gradient, the temperature gradient may be set to be negative, and vice versa.

After this equilibration stage, a growth period may be provided where the temperature gradient may be increased in magnitude and has a sign such that growth occurs at the seed crystal at a greater rate. For example, the temperature gradient may be increased at a rate in a range of from about 0.01 degrees Celsius/hr to about 25 degrees Celsius/hr, to a larger value where growth may be faster.

During the crystalline composition growth, the temperature gradient may be held at a temperature in a range of greater than about 550 degrees Celsius. The temperature may be in a range of from about 550 degrees Celsius to about 650 degrees Celsius, from about 650 degrees Celsius to about 750 degrees Celsius, from about 750 degrees Celsius to about 900 degrees Celsius, or greater than about 900 degrees Celsius. The hold temperature may be adjusted upward and/or downward during growth. Optionally, the temperature gradient may be changed to have a sign opposite to the sign where growth may occur at the seed crystal. The sign of the gradient may be reversed one or more additional times to alternately etch away spontaneously-formed nuclei and promote growth on one or more nucleation centers or seed crystalline compositions 120. The HPHT conditions may be maintained for a length of time sufficient to dissolve a substantial portion of the source gallium nitride and to precipitate onto at least one gallium nitride crystal, gallium nitride boule, or gallium nitride crystalline composition seed.

At the conclusion of the growth period the temperature of the capsule may be ramped down at a ramp rate in a range of from about 1 degrees Celsius/hr to about 100 degrees Celsius/hr, from about 100 degrees Celsius/hr to about 300 degrees Celsius/hr, from about 300 degrees Celsius/hr to about 500 degrees Celsius/hr, from about 500 degrees Celsius/hr to about 750 degrees Celsius/hr, or from about 750 degrees Celsius/hr to about 1000 degrees Celsius/hr. In one embodiment, the ramp rate may be selected to minimize thermal shock to the grown crystalline composition 132. The cell, including the capsule and pressure medium, may be removed from the pressure vessel 210 and the capsule 100 may be removed from the cell.

The solvent 130 may be removed by chilling the capsule to reduce the vapor pressure of the solvent below 1 bar, puncturing the capsule, and warming to evaporate the solvent. In another embodiment, the capsule may be punctured at or near room temperature, for example, by drilling a small hole or cutting off a fill tube, and the solvent may escape into a hood or other ventilated space. The capsule may be cut open and the grown crystal(s) removed. The crystal(s) may be washed by an appropriate wash, such as water, alcohol or other organic solvent, and by mineral acids to remove mineralizer.

In an alternative embodiment, a high quality seed crystal, free of tilt boundaries and with a dislocation density below about $10^4$ cm$^{-2}$, may be used as a substrate for deposition of a thick film of AlInGaN by another crystalline composition growth method. In one embodiment, the other crystalline composition growth method includes hydride vapor phase epitaxy (HVPE).

Characterization techniques, such as photoluminescence, may indicate the quality of the crystalline composition. Photoluminescence may occur at the band edge at room temperature for gallium nitride.

The crystalline composition may be processed and sliced into one or more wafers, lapped, polished, and/or chemically polished. Methods for slicing include sawing with a wire saw, a multi-wire saw, or an annular saw. Lapping and polishing may be performed with a slurry containing one or more diamond, silicon carbide, alumina, or other hard particles. Polishing may leave lattice damage in the gallium nitride wafer that may be removed by a number of methods, including chemical mechanical polishing, dry etching by reactive ion etching (RIE), high density inductively-coupled plasma (ICP) plasma etching, electron cyclotron resonance (ECR) plasma etching, and chemically assisted ion beam etching (CAIBE).

In another embodiment, the damaged GaN surface layer resulting from wafer polishing is oxidized and the oxide layer is then removed. Oxidation of the damaged surface layer may be carried out using at least one of a wet or dry thermal process, a plasma-assisted process, a UV light-enhanced process, photoelectrochemical oxidation, or a combination thereof. Wet oxidation may be performed by exposing the surface layer to an oxidizing agent, such as nitric acid, aqua regia, a mixture of sulfuric acid and nitric acid, perchloric acid, or a persulfate, chromate, dichromate, or permanganate salt at a temperature between 0° C. and 200° C. Dry oxidation may be performed by heating in an oxygen-containing ambient to a temperature between about 200° C. and about 900° C. or exposure to an oxygen-containing plasma. Wet oxidation may also be performed by exposure of the surface to ultraviolet light while in contact with a basic solution, optionally also containing an oxidizing agent or subjected to a positive electrical bias. The basic solution may comprise alkali hydroxide at a concentration of 0.005 M to 0.2 M. The ultraviolet light may contain radiation at wavelengths below 365 nm and may be produced by an unfiltered mercury arc lamp. The oxide layer may be removed by thermal annealing, for example, to a temperature between about 600° C. and about 1200° C. in vacuum or in a nitrogen- or ammonia-containing ambient, or wet chemical etching, for example, in alkali hydroxide or in concentrated acid. The oxidation and oxide-removal processes may be performed for durations between about $10^{-5}$ sec and about 60 min and may be applied repetitively. In one embodiment, both the oxidation and oxide removal steps are performed in a reactor suitable for performing epitaxial growth by metalorganic chemical vapor deposition or molecular beam epitaxy.

In another embodiment, the damaged GaN layer is annealed out, etched away, or thermally desorbed by heating to a temperature of 800-1500° C., for a time between 0.001 sec and 10 hours in a nitrogen- and/or hydrogen-containing ambient, such as nitrogen, hydrogen, ammonia, hydrazine, hydrazoic acid, a nitrogen plasma, or plasma-dissociated ammonia. In one embodiment, the annealing process is performed in a reactor suitable for performing epitaxial growth by metalorganic chemical vapor deposition or molecular beam epitaxy.

In another embodiment, lattice damage is removed by chemical mechanical polishing. The chemical mechanical polishing slurry may contain one or more of abrasive particles, pH modifiers, viscosity modifiers, dispersion agents, chelating agents, non-ionic surfactants, polymeric surfactants, amine or imine surfactants, tetra-alkyl ammonium compounds, fluoride salts, ammonium salts, and oxidizing agents. The abrasive particles may comprise one or more of silicon oxide, aluminum oxide, cerium oxide, chromium oxide, zirconium oxide, titanium oxide, hafnium oxide, molybdenum oxide, tungsten oxide, copper oxide, iron oxide, nickel oxide, manganese oxide, tin oxide, rare earth oxide, titanium diboride, titanium carbide, tungsten carbide, cubic boron nitride, silicon nitride, aluminum nitride, titanium nitride, glass powder with composition comprising at least one of $SiO_2$ or $Al_2O_3$, or metallic particles, and may have a diameter between about 10 nm and about 300 nm. In one embodiment, pH modifiers are added so that the pH of the slurry is between 0.5 and 4. In another embodiment the pH of the slurry is between 4 and 8, and in yet another the pH is between 8 and 13.5. The oxidizing agent may comprise at least one of hydrogen peroxide, nitro compounds, and potassium ferricyanide. The chelating agent may comprise ethylenediaminetetraacetic acid or the like.

The polished wafer may have an RMS surface roughness below about 1 nm over a lateral area of at least 10×10 mm$^2$. The surface roughness may be below 0.5 nm over a lateral area of at least 10×10 mm$^2$. The wafer or substrate has a thickness in a range of from about 0.01 and 10 mm, most in a range of from about 0.05 and 5 mm. The surface of the gallium nitride wafer may be flat to less than 1 micron. The front and back surfaces of the gallium nitride wafer may be parallel to better than 1°. In one embodiment, the crystallographic orientation of the front of the gallium nitride wafer may be within about 10° of one of the (0001) orientation, the (000$\bar{1}$) orientation, the (10$\bar{1}$0) orientation, the (11$\bar{2}$0) orientation, and the (10$\bar{1}$1) orientation. In one embodiment, the orientation of the front of the gallium nitride wafer may be within about 5° of one of these orientations.

Figure 7A:
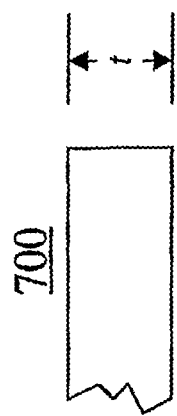
FIGS. 7A-7C is a schematic illustration of the edges of gallium nitride wafers with (a) a simply-ground edge; (b) a chamfered edge; or (c) a rounded edge.
Figure 7B:
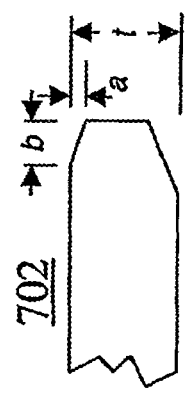
Figure 7C:
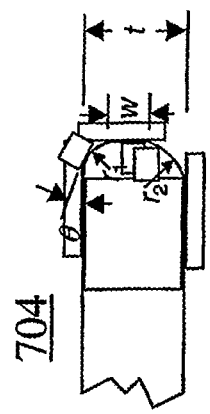

The gallium nitride may be ground to a round or square shape, with one or more additional flats to indicate the crystallographic orientation. In one embodiment 700, the edge of the gallium nitride wafer may be simply ground, as shown schematically in FIG. 7(a). However, the inventors have found that gallium nitride crystalline compositions or wafers crack easily, and a gallium nitride wafer with a simply ground edge may be particularly susceptible to chipping and cracking. In one embodiment 710, a chamfer may be ground on at least one of the front and back surfaces, as shown schematically in FIG. 7(b). The chamfer may be ground on the edge of the wafer using apparatus that may be well known in the art. The depth of the chamfer (dimension a in FIG. 7(b)) may be in a range of from about 10 micrometers and 0.2 t (dimension t in FIG. 7(b)), where t may be the thickness of the wafer. The width of the chamfer (dimension b in FIG. 7(b)) may be between a and 5a. If both the top (side on which epitaxy may be performed) and the bottom of the wafer may be chamfered, the larger chamfer may be placed on the bottom. A slight curvature may be present at the edges of the chamfered portions rather than sharp edges. In addition to reducing the tendency for the wafer to be chipped or cracked during handling, the chamfer also reduces the likelihood of crowning or poor morphology of epitaxially-grown AlInGaN near the periphery of the wafer. In one embodiment, the wafer edge 720 may be rounded, as shown schematically in FIG. 7(c). The radius of curvature of the top edge (dimension $r_1$ in FIG. 7(c)) of the wafer may be between 10 μm and 0.5 t (dimension t in FIG.

7(c)), where t may be the thickness of the wafer. The angle Θ between the inside edge of the rounded portion and the top surface of the wafer may be less than 30 degrees. The radius of curvature (dimension $r_2$ in FIG. 7(c)) of the bottom edge of the wafer may be greater than $r_1$, and also forms an angle with the bottom surface of the wafer that may be less than 30 degrees. The thickness of the unrounded edge (dimension w in FIG. 7(c)) of the wafer may be zero and may be less than 0.5 t.

This crystalline composition gallium nitride crystal, and wafers formed therefrom, may be useful as substrates for electronic and optoelectronic devices.

The crystalline composition may be characterized by standard methods. For determining the dislocation density, Cathodoluminescence (CL) and etch pit density may be convenient. CL imaging may provide a non-destructive measure of dislocation density, and requires little or no sample preparation. Dislocations may be non-radiative recombination centers in gallium nitride, and therefore appear in CL as dark spots. One can simply measure the concentration of dark spots in CL images to determine the dislocation density. A second test method may be etch pit density.

Figure 9:
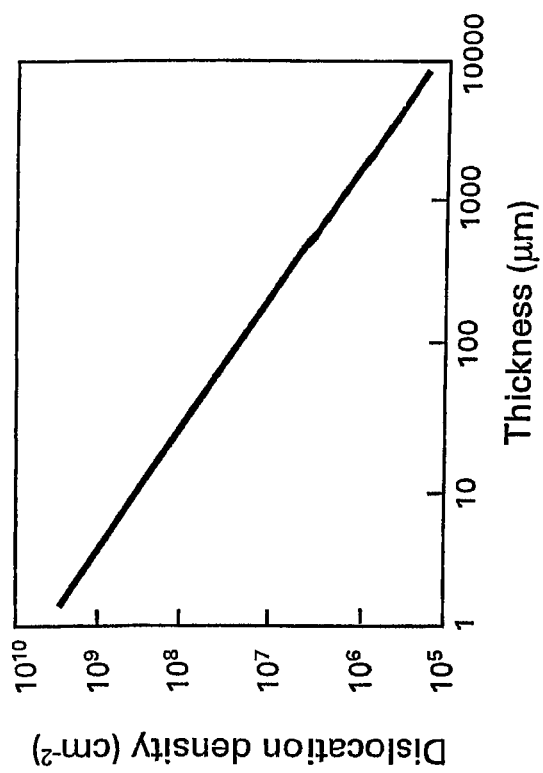
FIG. 9 shows the approximate dislocation density as a function of thickness for a gallium nitride film grown by HVPE.

Both of these methods were applied to the gallium face of a sample of commercial-grade HVPE gallium nitride dislocation densities (dark-spot densities or etch pit densities) of $1$-$2 \times 10^7$ cm$^{-2}$ were obtained, in excellent agreement with the values reported by others on similar material and those values shown in FIG. 9.

The optical absorption and emission properties of the grown gallium nitride can be determined by optical absorption, scattering, and photoluminescence spectroscopies. The electrical properties can be determined by Van der Pauw and Hall measurements, by mercury-probe CV, or by hot-probe techniques.

The crystalline composition may be sliced into one or more wafers by methods that may be well known in the art. The gallium nitride crystalline composition or wafer may be useful as a substrate for epitaxial $Al_xIn_yGa_{1-x-y}N$ films where $0 \leq x \leq 1$, $0 \leq y \leq 1$ and $0 \leq x+y \leq 1$, light emitting diodes, laser diodes, photodetectors, avalanche photodiodes, transistors, diodes, and other optoelectronic and electronic devices. Epitaxial gallium nitride or $Al_xIn_yGa_{1-x-y}N$ layers, where $0 \leq x$, y, $x+y \leq 1$, deposited on gallium nitride wafers fabricated from a bulk gallium nitride crystalline composition described herein may be free of tilt boundaries and may have a dislocation density below $10^4$ cm$^{-2}$. In one embodiment, the below $10^3$ cm$^{-2}$, and, even more preferably, below $100$ cm$^{-2}$.

Due to the substantial absence of tilt boundaries and the low dislocation density of the substrate, the homoepitaxial light-emitting device may be free of tilt boundaries. In one embodiment, for a device area up to about $10^4$ μm$^2$, up to about $9 \times 10^4$ μm$^2$, or up to 1 mm$^2$ the device may be free of threading dislocations.

The above described embodiments provide improved nucleation control by including an equilibration period in the temperature program, in which the temperature gradient may be reduced, or even set to be zero or negative, with respect to the gradient during crystalline composition growth, and by hanging the seed crystal within the growth chamber. The crystalline composition growth method may provide high quality, large area gallium nitride crystals.

A gallium nitride crystalline composition formed by the above method was characterized using etch pit density measurements, photoluminescence, and optical absorption techniques. The crystalline composition formed may be characterized by a dislocation density below 100 cm$^{-1}$, a photoluminescence spectrum which peaks at a photon energy of in a range of from about 3.38 to about 3.41 eV at a crystalline composition temperature of 300° K, and has an optical absorption coefficient below 5 cm$^{-1}$ for wavelengths between 700 nm (red) and 465 nm (blue).

A gallium nitride crystalline composition formed by the above method was characterized by infrared transmission spectroscopy and by Raman spectroscopy. In contrast to gallium nitride grown by other methods, the gallium nitride grown by the method described herein had several sharp absorption peaks in the range of 3050 to 3300 cm$^{-1}$, with a maximum absorption near 3175 cm$^{-1}$, as shown in FIG. 8. The crystalline composition was annealed to 750° C. in high purity nitrogen for 30 min and the infrared spectrum was re-measured. The absorption peaks in the range of 3050 to 3300 cm$^{-1}$ were essentially unchanged, as shown in FIG. 8, indicating a high stability of the species responsible for the absorption peaks. Based on predictions of vibrational frequencies of 3100-3470 cm$^{-1}$ for $V_{Ga}H_1$-$V_{Ga}H_4$ (which may overestimate the actual frequencies by about 200 cm$^{-1}$) and the observation of infrared absorption features at 3020-3050 cm$^{-1}$ and at 3140 cm$^{-1}$ in hydrogen-implanted gallium nitride [M. G. Weinstein et al., Appl. Phys. Lett. 72, 1703 (1998)], the absorption peaks between 3150 and 3200 cm$^{-1}$ in samples according to embodiments correspond to $V_{Ga}H_3$ and $V_{Ga}H_4$, that the absorption peaks observed between 3000 and 3150 cm$^{-1}$ in both the crystalline composition and in the hydrogen-implanted gallium nitride correspond to $V_GH_1$ and $V_{Ga}H_2$, and that other minor peaks may be associated with the presence of other impurities or defects. The presence of an infrared absorption feature near 3175 cm$^{-1}$ in gallium nitride crystalline composition grown by the method described herein indicates passivation of gallium vacancies, and the persistence of the infrared feature upon high temperature annealing indicates that this passivation may be quite stable. Depending on the concentration of hydrogenated gallium vacancies in the gallium nitride crystal, the absorbance per unit thickness of the 3175 cm$^{-1}$ peak may lie in a range of from about 0.01 and 200 cm$^{-1}$.

Additional evidence for the passivation of point defects in a gallium nitride crystalline composition grown by the method described herein may be obtained by Raman spectroscopy. A total of five peaks may be observed in two configurations between 400 and 800 cm$^{-1}$. The peaks, with the respective assignments given in brackets, were observed at 530 cm$^{-1}$ [$A_1$(TO)], 558 cm$^{-1}$ [$E_1$ (TO)], 569 cm$^{-1}$ [$E_2$ (high)], 734 cm$^{-1}$ [$A_1$(LO)], and 742 cm$^{-1}$ [$E_1$(LO)]. These values may be all within a few cm$^{-1}$ of accepted values for pure gallium nitride reported in the literature. Significantly, a broad peak associated with phonon-plasmon coupling was not observed. The observation of unshifted LO modes and the absence of a phonon-plasmon mode indicates a carrier concentration below $10^{17}$ cm$^{-3}$, based on Raman measurements reported in the literature on gallium nitride with carrier concentrations between $10^{16}$ cm$^{-3}$ and $10^{20}$ cm$^{-3}$. The total impurity concentration in this crystalline composition was above $10^{19}$ cm$^{-3}$. The drastic reduction in carrier concentration relative to the impurity concentration indicates a high degree of compensation, most likely due to hydrogen.

The incorporated hydrogen may be benign or possibly even beneficial. By way of contrast, typical or conventional gallium nitride growth methods may not provide passivation of gallium vacancies by hydrogenation, even if hydrogen may be in the growth system. For example, infrared transmission spectroscopy on 300-400 millimeters thick gallium nitride samples grown by hydride vapor phase epitaxy (HVPE) revealed weak absorption features near 2850 and 2915 $cm^{-1}$ associated with another defect, but no absorption features between 3100 and 3500 $cm^{-1}$ that could be assigned to hydrogenated gallium vacancies were observed in the HVPE gallium nitride material.

Continuing with passivated gallium vacancies, the lattice structure and chemical and electrical properties of a crystalline composition may differ relative to a crystal without vacancies, with vacancies that are not passivated, and over differing levels of passivation. In one embodiment, the gallium-poor crystal may be formed, and then passivated using, for example, hydrogen interfusion at elevated temperature and pressure. In another embodiment, the vacancies are formed, and passivated, in a non-gallium crystal. Control of the level of vacancies (for example, by control of the raw material type, quantity, or processing conditions) and of the level of passivation may allow for tailoring of the crystalline composition properties in a determined manner.

Within the visible spectrum, a gallium nitride boule may be transparent and colorless. The optical absorption coefficient for nominally undoped crystalline composition may be less than 5 $cm^{-1}$ between 465 nm and 700 nm. Doped crystalline composition may exhibit similarly low absorption, although some free carrier absorption may be introduced at high carrier concentrations. Moreover, dopants, substitutional or interstitial impurities, vacancy complexes, or other point defects may introduce narrow peaks of higher absorption within the visible range. Such point defect-related narrow absorption peaks may not, however, significantly reduce the transparency of the crystalline composition in the visible, such as in the backside extraction of emitted light.

In the case where a gallium nitride boule may be grown using at least one of HX, $NH_4$, $GaX_3$, (where X is halogen), or other compounds obtainable by reaction of Ga, gallium nitride, $NH_3$, and HF, as mineralizer, the gallium nitride may contain at least about 0.04 ppm fluorine, and in a range of from about 0.04 and 1 ppm fluorine. By contrast, gallium nitride crystalline composition grown with fluorine-free mineralizers contain less than 0.02 ppm fluorine. As with the case of incorporated hydrogen, the incorporated fluorine may be believed to be benign or possibly even beneficial. Bond lengths to fluorine in molecules or solids may be only slightly larger than the corresponding bonds to hydrogen, so that fluorine may play a similar role passivating defects.

After the gallium nitride crystalline composition forms, the crystalline composition or boule may be processed and sliced into one or more wafers, lapped, polished, and chemically polished. The wafer or substrate has a thickness in a range of from about 0.01 millimeters to about 0.05 millimeters, from about 0.05 millimeters to about 5 millimeters, or from about 5 millimeters to about 10 millimeters, and may be useful as a substrate for the device fabrication. A suitable wafer may include n-type gallium nitride, with an electrical resistivity less than about 100Ω-cm. In one embodiment, the wafer may have an electrical resistivity less than about 10Ω-cm, in a range of from about 10Ω-cm to about 1Ω-cm, or less than about 1Ω-cm. In one embodiment, the wafer includes p-type gallium nitride, and in still another embodiment the wafer includes semi-insulating gallium nitride. The substrate may be polished to a mirror finish using mechanical-polishing techniques that may be known in the art. Subsurface damage may remain after the polishing process. This damage may be removed by several methods that may be known in the art, including chemically assisted ion beam etching, reactive ion etching, chemo-mechanical polishing, and photoelectrochemical or wet chemical etching.

The residual damage may be removed by heating the wafer to a temperature in a range of from about 700 degrees Celsius to about 1500 degrees Celsius in a nitrogen-containing atmosphere, such as, for example, $N_2$ gas or ammonia, at a partial pressure in a range of from about $10^{-8}$ mbar to about 20,000 bar. The substrate has a thickness in a range of from about 0.01 millimeters and 0.05 mm, in a range of from about 0.05 millimeters to about 5 millimeters, or from about 5 millimeters to about 10 millimeters.

A gallium nitride crystalline composition may be provided that is at least about 2 millimeters in at least one dimension x or y, with a dislocation density of less than about $10^4$ $cm^{-1}$, and having no tilt boundaries. In one embodiment, at least one dimension x or y is in a range of from about 2 mm to about 2.75 mm, from about 2.75 mm to about 3 mm, from about 3 mm to about 5 mm, from about 5 mm to about 1 centimeter, from about 1 centimeter to about 2 centimeter, from about 2 centimeters to about 7.5 centimeters, from about 7.5 centimeters to about 10 centimeters, or greater than about 10 centimeters. A gallium nitride crystalline composition may be at least about 2 millimeters in at least one dimension x or y, and free of tilt boundaries, and may have a photoluminescence spectrum which peaks at a photon energy of in a range of from about 3.38 to about 3.41 eV at a crystalline composition temperature of 300 K.

In accordance with another aspect of the invention, there may be provided a method of forming a gallium nitride single crystal. The method includes (a) providing a nucleation center in a first region of a chamber; (b) providing a gallium nitride source material in a second region of the chamber; (c) providing a gallium nitride solvent in the chamber; (d) pressurizing the chamber; (e) generating and holding a first temperature distribution such that the solvent may be supersaturated in the first region of the chamber and such that there may be a first temperature gradient between the nucleation center and the gallium nitride source material such that gallium nitride crystalline composition grows on the nucleation center; and (f) generating a second temperature distribution in the chamber such that the solvent may be supersaturated in the first region of the chamber and such that there may be a second temperature gradient between the nucleation center and the gallium nitride source material such that gallium nitride crystalline composition grows on the nucleation center, wherein the second temperature gradient may be larger in magnitude than the first temperature gradient and the crystalline composition growth rate may be greater for the second temperature distribution than for the first temperature distribution.

In accordance with another aspect of the invention, a method of forming a gallium nitride single crystal or quasi-single crystal is provided. The method includes (a) providing a nucleation center in a first region of a chamber having a first end; (b) providing a gallium nitride source material in a second region of the chamber having a second end; (c) providing a gallium nitride solvent in the chamber; (d) pressurizing the chamber to a pressure in a range of from about 5 kbar to 10 kbar, from about 10 kbar to about 25 kbar, or from about 25 millimeters to about 80 kbar; (e) generating and holding a first temperature distribution having an average temperature in a range of from about 550 degrees Celsius to about 1200 degrees Celsius such that the solvent may be supersaturated in the first region of the chamber and such that there may be a first temperature gradient between the first end and the second end such that gallium nitride crystalline composition grows on the nucleation center; and (f) generating a second temperature distribution in the chamber having an average temperature in a range of from about 550 degrees Celsius to about 1200 degrees Celsius such that the solvent may be supersaturated in the first region of the chamber and such that there may be a second temperature gradient between the first end and the second end such that gallium nitride crystalline composition grows on the nucleation center, wherein the second temperature gradient may be larger in magnitude than the first temperature gradient and the crystalline composition growth rate may be greater for the second temperature distribution than for the first temperature distribution.

In accordance with another aspect of the invention, a method may be used to form a gallium nitride crystalline composition. The method includes (a) providing a nucleation center in a first region of a chamber having a first end; (b) providing a gallium nitride source material in a second region of the chamber having a second end; (c) providing a gallium nitride solvent in the chamber; (d) pressurizing the chamber; (e) generating and holding a first temperature distribution such that there may be a first temperature gradient between the first end and the second end; and (f) generating a second temperature distribution in the chamber such that the solvent may be supersaturated in the first region of the chamber and such that there may be a second temperature gradient between the first end and the second end such that gallium nitride crystalline composition grows on the nucleation center, wherein the first temperature gradient may be zero or opposite in sign from the second temperature gradient. The crystalline composition may be a single crystal.

EXAMPLES

The following examples illustrate methods and embodiments in accordance with the invention and do not limit the claims. Unless specified otherwise, all ingredients are commercially available from such common chemical suppliers as Alpha Aesar, Inc. (Ward Hill, Mass.), Sigma-Aldrich Company (St. Louis, Mo.), and the like. The following Comparative Examples (Comparative Examples 1-3) are provided for comparison to the Examples (Examples 1-4).

Comparative Example 1

0.1 grams of $NH_4F$ mineralizer is placed in the bottom of an about 1.25 centimeters diameter silver capsule. A baffle with 5.0 percent open area is placed in the middle portion of the capsule, and 0.31 grams of polycrystalline gallium nitride source material is placed in the upper half of the capsule. The capsule is enclosed within a filler/sealing assembly together with a 1.25 centimeters diameter steel ring. The capsule and filler/sealing assembly are transferred to a gas manifold and filled with 0.99 grams of ammonia. Next, a plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke high-pressure high temperature (HPHT) apparatus. The cell is heated to approximately 700 degrees Celsius and held at this temperature for 55 hours, with a temperature gradient of approximately 85 degrees Celsius. The cell is cooled and removed from the press.

Upon opening the capsule after venting of the ammonia, numerous spontaneously-nucleated crystalline composition are observed at the bottom of the capsule. One crystalline composition approximately 0.36 millimeters in diameter is selected at random and etched in 10 percent hydrochloric acid (HCl) in Argon at 625 degrees Celsius for 30 minutes. No etch pits are observed. The area of the exposed c-face is approximately $5.3 \times 10^{-4}$ cm$^2$, indicating that the etch pit density is less than $(1/(5.3 \times 10^{-4}$ cm$^2))$ or 1900 cm$^{-2}$. By contrast, the etching treatment is applied to a 200 μm-thick piece of gallium nitride grown by hydride/halide vapor phase epitaxy (HVPE), and an etch pit density of $2 \times 10^7$ cm$^{-2}$ is observed on the gallium face. The observed etch pit density of the HVPE-grown sample is in good agreement with FIG. 9 for material that is grown to a thickness of about 300 micrometers before being lapped and polished.

Comparative Example 2

Three seeds, weighing 3 mg to 4 mg each, are placed in the bottom of a about 1.25 centimeters diameter silver capsule along with 0.10 grams of $NH_4F$ mineralizer. A baffle with 5.0 percent open area is placed in the middle portion of the capsule, and 0.34 grams of polycrystalline gallium nitride source material is placed in the upper half of the capsule. The capsule is enclosed within a filler/sealing assembly together with a 0.675 inch diameter steel ring. The capsule and filler/sealing assembly are transferred to the gas manifold and filled with 1.03 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus.

The cell is heated at about 15 degrees Celsius/min to approximately 500 degrees Celsius, at 0.046 degrees Celsius/min to 700 degrees Celsius, and held at the latter temperature for 6 hours, with a temperature gradient of approximately 28 degrees Celsius. The cell is cooled and removed from the press. Upon opening the capsule after venting of the ammonia, numerous spontaneously-nucleated crystalline composition are observed at the bottom of the capsule and, despite the very slow heating rate, very little growth on the seeds occurred, relative to growth on spontaneously-nucleated crystals.

Comparative Example 3

A gallium nitride seed, weighing 10.4 mg, is placed in the bottom of a about 1.25 centimeters diameter silver capsule along with 0.04 grams of $NH_4F$ mineralizer. A baffle with 5.0 percent open area is placed in the middle portion of the capsule, and 0.74 grams of polycrystalline gallium nitride source material is placed in the upper half of the capsule. The capsule is enclosed within a filler/sealing assembly together with a 0.675 inch diameter steel ring. The capsule and filler/sealing assembly are transferred to the gas manifold and filled with 1.14 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus. The cell is heated at about 15 degrees Celsius/min to approximately 500 degrees Celsius, at 0.05 degrees Celsius/min to 680 degrees Celsius, and held at the latter temperature for 53 hours, with a temperature gradient of approximately 70 degrees Celsius. The cell is cooled and removed from the press. Upon opening the capsule after venting of the ammonia, numerous spontaneously-nucleated crystalline compositions are observed at the bottom of the capsule despite the very slow heating rate. The seed grows to a weight of 41.7 mg and a diameter of about 2 mm. However, the weight of spontaneously-nucleated crystalline compositions is more than 10 times the weight increase of the seed.

Example 1

A small hole is drilled by a high-power laser through a gallium nitride seed crystal weighing 19.7 mg. The seed is hung by a 0.13-mm silver wire from a silver baffle with a 35 percent open area and placed in the lower half of a about 1.25 centimeters diameter silver capsule along with 0.10 grams of $NH_4F$ mineralizer. 0.74 grams of polycrystalline gallium nitride source material is placed in the upper half of the capsule. The capsule is enclosed within a filler/sealing assembly together with a 0.583 inch diameter steel ring. The capsule and filler/sealing assembly are transferred to a gas manifold and filled with 0.99 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus.

The cell is heated at a rate of about 11 degrees Celsius/min until the temperature of the bottom of the capsule is approximately 700 degrees Celsius and the temperature of the top half of the capsule is approximately 660 degrees Celsius, as measured by type K thermocouples. The current through the top half of the heater is increased until the temperature gradient $\Delta T$ decreased to zero. After holding at $\Delta T=0$ for 1 hour, the temperature of the top half of the capsule is decreased at 5 degrees Celsius/hr until $\Delta T$ □□increased to approximately 35 degrees Celsius, and the temperatures are held at these values for 78 hr. The cell is cooled and removed from the press. Upon opening the capsule after venting of the ammonia, the seed weight is observed to have increased to 33.4 mg.

Figure 3:
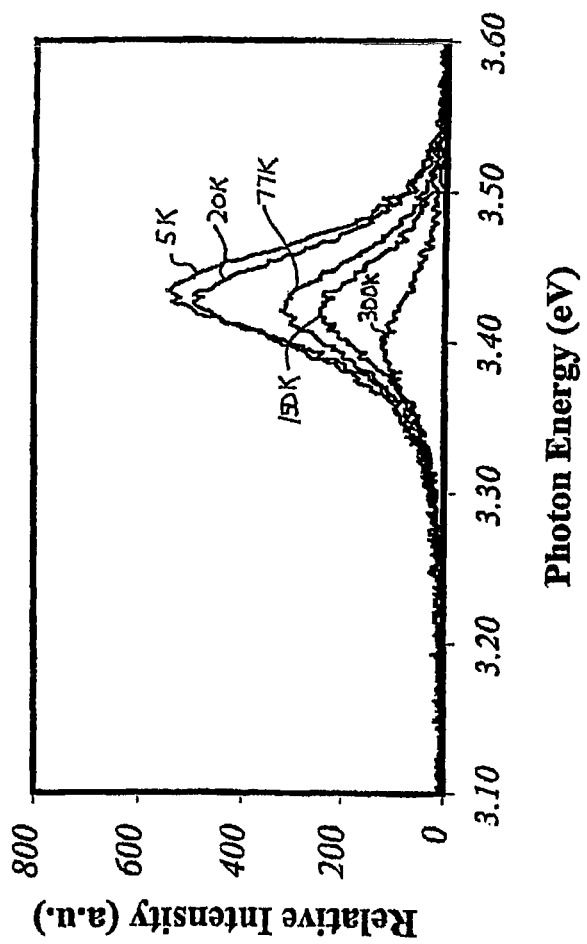
FIG. 3 is a series of photoluminescence spectra of a crystalline composition according to an embodiment of the invention.

The crystalline composition is characterized by photoluminescence, using a 266 nm excitation (frequency-quadrupled YAG). The spectra at several temperatures are shown in FIG. 3. Specifically the crystalline composition sample is characterized by photoluminescence at temperatures of 5 K, 20 K, 77 K and 300 K. At all temperatures in the range of 5K-300 K, the luminescence peak occurs between 3.38 and 3.45 eV.

Example 2

A gallium nitride seed crystal weighing 12.6 mg, obtained from a previous run, is hung through a laser-drilled hole by a 0.13-mm silver wire from a silver baffle with a 35 percent open area and placed in the lower half of a about 1.25 centimeters diameter silver capsule. 0.10 grams of $NH_4F$ mineralizer and 1.09 grams of polycrystalline gallium nitride source material are placed in the upper half of the capsule. The capsule is enclosed within a filler/sealing assembly together with a 0.583 inch diameter steel ring. The capsule and filler/sealing assembly are transferred to the gas manifold and filled with 0.95 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus. The cell is heated at a rate of about 11 degrees Celsius/min until the temperature of the bottom of the capsule is approximately 700 degrees Celsius and the temperature of the top half of the capsule is approximately 640 degrees Celsius, as measured by type K thermocouples. The current through the top half of the heater is increased until the temperature gradient $\Delta T$ decreased to zero. After holding at $\Delta T=0$ for 1 hour, the temperature of the top half of the capsule is decreased at 5 degrees Celsius/hr until $\Delta T$ increased to approximately 50 degrees Celsius, and the temperatures are held at these values for 98 hr. The cell is cooled and removed from the press.

Upon opening the capsule after venting of the ammonia, the seed has grown to a weight of 24.3 mg. The crystalline composition is etched in 10 percent HCl in Ar at 625 degrees Celsius for 30 min. Some etch pits are observed on the c-face above the region of the seed, with an etch pit density of about $10^6$ $cm^{-2}$. However, the areas that grow laterally with respect to the seed are free of etch pits. The area of newly laterally-grown gallium nitride is approximately $3.2 \times 10^{-2}$ $cm^2$, indicating that the etch pit density is less than ($1/3.2 \times 10^{-2}$ $cm^2$) or 32 $cm^{-2}$.

Example 3

Two gallium nitride seeds, weighing 48.4 mg and 36.6 mg and obtained from a previous run, are hung through laser-drilled holes by a 0.13-mm silver wire from a silver baffle with a 35 percent open area and placed in the lower half of a about 1.25 centimeters diameter silver capsule. 0.10 grams of $NH_4F$ mineralizer and 1.03 grams of polycrystalline gallium nitride source material are placed in the upper half of the capsule. The capsule is enclosed within a filler/sealing assembly together with a 0.583 inch diameter steel ring. The capsule and filler/sealing assembly are transferred to the gas manifold and filled with 1.08 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus. The cell is heated at about 11 degrees Celsius/min until the temperature of the bottom of the capsule is approximately 700 degrees Celsius and the temperature of the top half of the capsule is approximately 642 degrees Celsius, as measured by type K thermocouples. The current through the top half of the heater is increased until the temperature gradient $\Delta T$ decreased to zero. After holding at $\Delta T=0$ for 1 hour, the temperature of the top half of the capsule is decreased at 5 degrees Celsius/hr until $\Delta T$ increased to approximately 30 degrees Celsius, and the temperatures are held at these values for 100 hr. The cell is cooled and removed from the press.

Upon opening the capsule after venting of the ammonia, the seeds had grown to a weight of 219.8 mg. A piece broke off from the smaller of the two crystalline compositions and is selected for analysis. An optical transmission spectrum of the crystalline composition is measured using a Cary 500i spectrometer. The transmission is greater than 60 percent for wavelengths ranging from red (700 $cm^{-1}$) to blue (465 $cm^{-1}$). Based on the index of refraction for gallium nitride [G Yu et al., Applied Physics Letters 70, 3209 (1997), which is hereby incorporated by reference] and the thickness of the crystal, 0.206 mm, the optical absorption coefficient is less than 5 cm$^{-1}$ over the same wavelength range. The crystalline composition is determined to have n-type electrical conductivity by means of a hot-point probe measurement. The crystalline composition is etched in 10 percent HCl in Ar at 625 degrees Celsius for 30 min. The entire crystalline composition is free of etch pits. The area of the c-face of the crystalline composition is approximately 4.4×10$^{-2}$ cm$^2$, indicating that the etch pit density is less than (1/4.4×10$^{-2}$ cm$^2$) or 23 cm$^{-2}$.

Example 4

A gallium nitride seed weighing 25.3 mg, obtained from a previous run, is hung through a laser-drilled hole by a 0.13-mm silver wire from a silver baffle with a 35 percent open area and placed in the lower half of a about 1.25 centimeters diameter silver capsule. 0.10 grams of NH$_4$F mineralizer and 0.98 grams of polycrystalline gallium nitride source material are placed in the upper half of the capsule. The capsule is enclosed within a filler/sealing assembly together with a 0.583 inch diameter steel ring. The capsule and filler/sealing assembly are transferred to the gas manifold and filled with 1.07 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus. The cell is heated at about 11 degrees Celsius/min until the temperature of the bottom of the capsule is approximately 700 degrees Celsius and the temperature of the top half of the capsule is approximately 648 degrees Celsius, as measured by type K thermocouples. The current through the top half of the heater is increased until the temperature gradient ΔT decreased to 3 degrees Celsius. After holding at ΔT=3 degrees Celsius for 1 hour, the temperature of the top half of the capsule is decreased at 5 degrees Celsius/hr until ΔT☐ increased to approximately 30 degrees Celsius, decreased further at 2.5 degrees Celsius/hr until ΔT increased to approximately 60 degrees Celsius and the temperatures are held at these values for 20 hr. The cell is cooled and removed from the press.

Upon opening the capsule after venting of the ammonia, the seed had grown to a weight of 40.2 mg. The crystalline composition is etched in 50 percent HNO$_3$ for 30 min. A row of etch pits is observed on the c-face above the interface between the seed and new, laterally-grown material. However, the remaining areas of newly-grown gallium nitride are free of etch pits. The area of pit-free newly grown gallium nitride is approximately 6.9×10$^{-2}$ cm$^2$, indicating that the etch pit density is less than (1/6.9×10$^{-2}$ cm$^2$) or 14 cm$^{-2}$.

Example 5

A gallium nitride seed weighing 13.5 mg, grown by HVPE, is hung through a laser-drilled hole by a 0.13-mm silver wire from a silver baffle with a 35 percent open area and placed in the lower half of a about 1.25 centimeters diameter silver capsule. 0.10 grams of NH$_4$F mineralizer, 0.031 grams of CoF$_2$, and 0.304 grams of polycrystalline gallium nitride source material are placed in the upper half of the capsule. The capsule is enclosed within a filler/sealing assembly together with a 0.583 inch diameter steel ring. The capsule and filler/sealing assembly are transferred to the gas manifold and filled with 1.01 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus. The cell is heated at about 11 degrees Celsius/min until the temperature of the bottom of the capsule is approximately 700 degrees Celsius and the temperature of the top half of the capsule is approximately 635 degrees Celsius, as measured by type K thermocouples, and the temperatures are held at these values for 10 hr. The cell is cooled and removed from the press.

Upon opening the capsule after venting of the ammonia, the seed weight is 10.3 mg, but had become thicker (0.7 millimeters thick) and is essentially black; e.g., considerably darker in color than nominally undoped crystals. Seed crystals used with NH$_4$F as a mineralizer undergo etching before the onset of crystalline composition growth. After washing, the Co-doped gallium nitride crystalline composition is sandwiched between two pieces of Indium foil which had been wet with a liquid Ga—In alloy with an electrode area of approximately 0.02 cm$^2$. The electrical resistance across the crystalline composition is found to be approximately 1,050 MΩ at room temperature, corresponding to a resistivity of about 3×10$^8$Ω-cm. Gallium nitride with a resistivity greater than about 10$^5$Ω-cm is semi-insulating. The crystalline composition is placed in a photoluminescence apparatus and illuminated with a 266-nm nitrogen laser. No photoluminescence is observable. The ratio of the intensity of near-band-edge photoluminescence from the black gallium nitride crystalline composition to that of a near-transparent, nominally undoped gallium nitride crystalline composition is less than 0.1 percent.

Example 6

A gallium nitride seed grown by HVPE is hung through a laser-drilled hole by a 0.13-mm silver wire from a silver baffle with a 10 percent open area and placed in the lower half of a about 1.25 centimeters diameter silver capsule. 0.10 grams of NH$_4$F mineralizer, 0.087 grams of Fe$_x$N and 0.305 grams of polycrystalline gallium nitride source material are placed in the upper half of the capsule. The capsule is enclosed within a filler/sealing assembly together with a 0.583 inch diameter steel ring. The capsule and filler/sealing assembly are transferred to the gas manifold and filled with 1.12 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus. The cell is heated at about 11 degrees Celsius/min until the temperature of the bottom of the capsule is approximately 700 degrees Celsius and the temperature of the top half of the capsule is approximately 630 degrees Celsius, as measured by type K thermocouples, and the temperatures are held at these values for 10 hr. The cell is cooled and removed from the press.

Upon opening the capsule after venting of the ammonia, the seed had grown to a thickness of 170 micrometers (μm) and had a reddish/amber color. After washing, the Fe-doped gallium nitride crystalline composition is sandwiched between two pieces of Indium foil which had been wet with a liquid Ga—In alloy with an electrode area of approximately 0.02 cm$^2$. The electrical resistance is over 32 MΩ☐ at room temperature, corresponding to a resistivity of over $3 \times 10^7 \Omega$-cm. Gallium nitride with a resistivity greater than about $10^5 \Omega$-cm is considered as semi-insulating.

Example 7

A gallium nitride seed weighing 14.3 mg, grown by HVPE, is hung through a laser-drilled hole by a 0.13-mm silver wire from a silver baffle with a 35 percent open area and placed in the lower half of a about 1.25 centimeters diameter silver capsule. 0.10 grams of $NH_4F$ mineralizer, 0.026 grams of $Mn_xN$ and 1.008 grams of polycrystalline gallium nitride source material are placed in the upper half of the capsule. The capsule is enclosed within a filler/sealing assembly together with a 0.583 inch diameter steel ring. The capsule and filler/sealing assembly are transferred to the gas manifold and filled with 1.04 grams of ammonia. Next, the plug is inserted into the open top end of the capsule, such that a cold weld is formed between the silver capsule and silver plug and the steel ring surrounded the plug and provided reinforcement. The capsule is removed from the filler/sealing assembly and inserted in a zero stroke HPHT apparatus. The cell is heated at about 11 degrees Celsius/min until the temperature of the bottom of the capsule is approximately 700 degrees Celsius and the temperature of the top half of the capsule is approximately 650 degrees Celsius, as measured by type K thermocouples, and the temperatures are held at these values for 60 hr. The cell is cooled and removed from the press.

Upon opening the capsule after venting of the ammonia, the seed had grown to a weight of 53.4 mg and is 350 micrometers thick and showed an orange color. Susceptibility measurements demonstrated that the Mn-doped gallium nitride crystalline compositions are paramagnetic.

Example 8

0.100 g, 0.200 g, or 0.500 grams of $NH_4F$ is added to three separate about 1.25 centimeters silver capsules. Also added to each capsule are 0.36 grams of polycrystalline gallium nitride and 0.9-1.0 grams of ammonia, using the filler/sealing assembly. The concentrations of $NH_4F$ mineralizer, expressed as a mole ratio with respect to ammonia, are 5.4 percent, 9.3 percent, and 23.7 percent, respectively, in the three capsules. The sealed capsules are placed in a cell in a zero-stroke high-pressure apparatus and heated to 700 degrees Celsius, held at this temperature for 8 hours, and cooled. Gallium nitride crystalline compositions grew in all three capsules. Also present in each capsule are crystalline compositions comprising $GaF_3(NH_3)_2$ and $(NH_4)_3GaF_6$. The weights of the Ga-containing complexes are 0.12 g, 0.25 g, and 0.65 g, respectively, in the three capsules, indicating that the concentration of dissolved Ga-containing species is approximately proportional to the initial mineralizer concentration. The weights of undissolved polycrystalline gallium nitride in the three capsules are 0.29 g, 0.23 g, and 0.03 g, respectively, indicating that higher concentrations of mineralizer enabled more rapid dissolution and transport of gallium nitride.

Example 9

A hole 2 millimeters in diameter is laser-cut in the center of a 1-cm square gallium nitride seed crystal. The seed crystal is hung from a 25 percent open-area baffle and placed inside a 1.1 inch diameter silver capsule. 1.000 grams of $NH_4F$ and 15.276 grams of polycrystalline gallium nitride are added to a 1.1 inch diameter silver capsule inside a glove box, a lid with a 0.12 inch diameter fill tube is welded to the top of the capsule. The fill tube is attached to a gas manifold without any air exposure to the contents and the capsule is evacuated, filled with 8.44 grams of $NH_3$. The fill tube is welded shut. The capsule is placed in a cell in a zero-stroke high-pressure apparatus. The cell is heated at about 11 degrees Celsius/min until the temperature of the bottom of the capsule is approximately 700 degrees Celsius and the temperature of the top half of the capsule is approximately 650 degrees Celsius, as measured by type K thermocouples. The current through the top half of the heater is increased until the temperature gradient $\Delta T$ decreased to zero. After holding at $\Delta T=0$ for 1 hour, the temperature of the top half of the capsule is decreased at 5° C./hr until $\Delta T$ increased to approximately 30 degrees Celsius, and the temperatures are held at these values for 100 hr. The cell is cooled and removed from the press.

Figure 11:
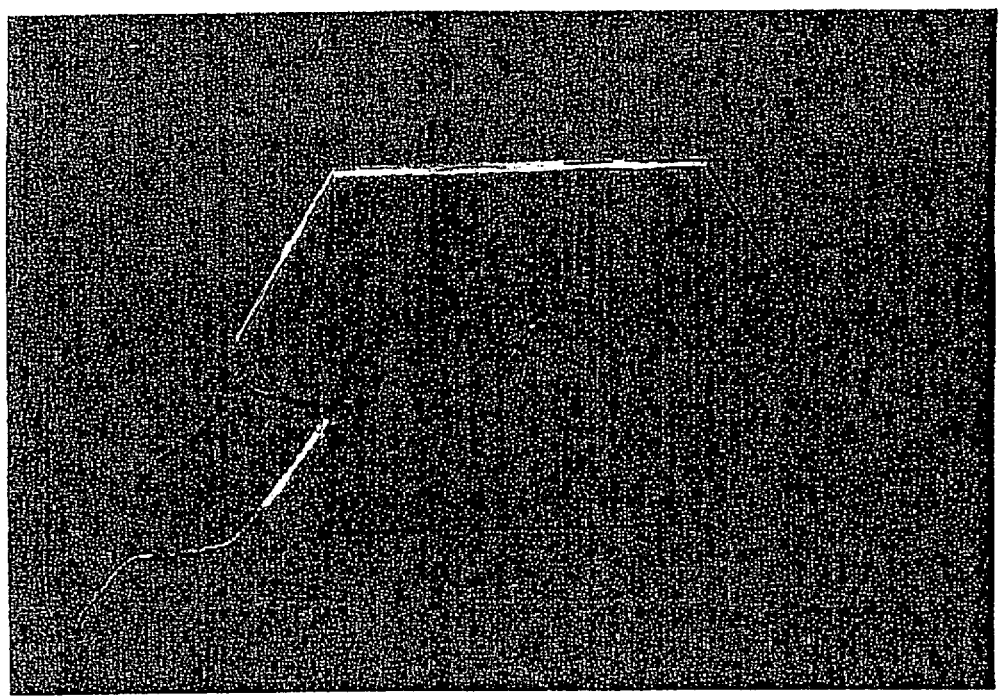
FIG. 11 is a photograph of another crystalline composition grown by a method in accordance with an embodiment of the invention.
Figure 12:
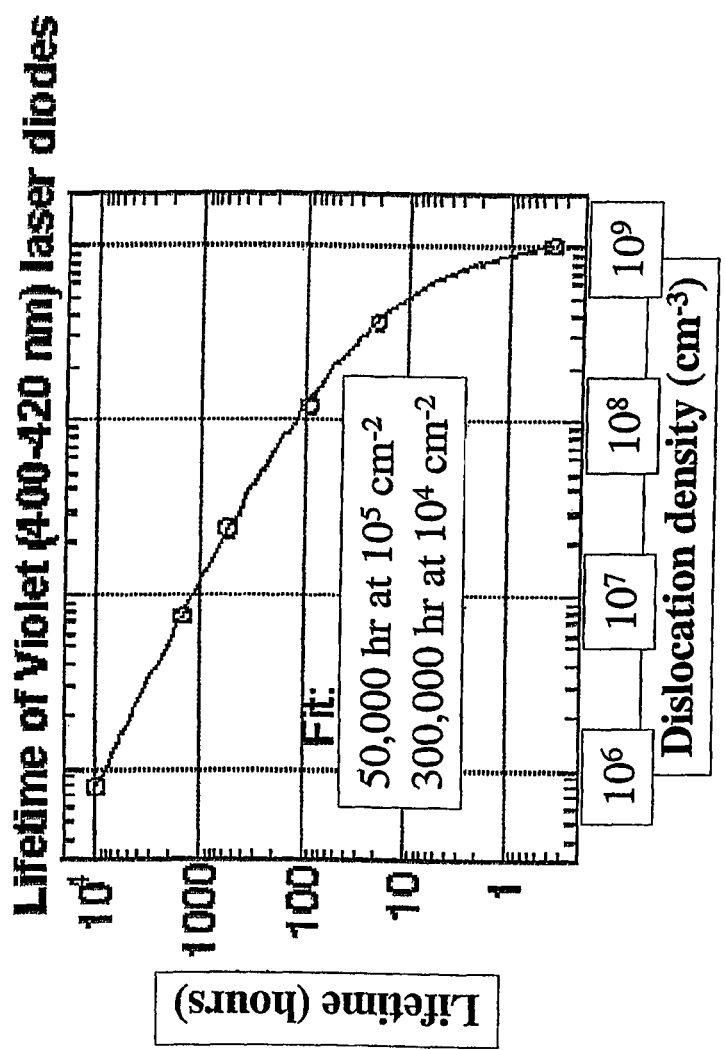
FIG. 12 is a plot showing the dependence of laser diode lifetime on dislocation density.

Upon opening the capsule after venting of the ammonia, the seed is found to have grown laterally to about 11.7×16.0 millimeters and filled in the hole in the center. The crystal, shown in FIG. 11, comprised essentially dislocation-free material over the hole and at its periphery, although boundaries at the position where laterally-grown gallium nitride coalesced over the seed are visible. The growth rate in the m direction is about 17 μm/hr and the growth rate in the a-direction is about 60 μm/hr, more than enough to fill the hole in the seed with high quality material.

Example 10

A 18×18×18 millimeters long triangle shape gallium nitride seed crystal about 0.2 millimeters thick is hung from a 15 percent open-area baffle and placed inside a 1.1 inch diameter silver capsule. 0.998 grams of $GaF_3$, 0.125 grams of $NH_4F$, and 10.118 grams of polycrystalline gallium nitride are added to the capsule inside a glove box, a lid with a 0.12 inch diameter fill tube is welded to the top of the capsule. The fill tube is attached to a gas manifold without any air exposure to the contents and the capsule is evacuated, and filled with 9.07 grams of $NH_3$. The fill tube is welded shut. The capsule is placed in a cell in a zero-stroke high-pressure apparatus. The cell is heated until the temperature of the bottom of the capsule is approximately 750 degrees Celsius and the temperature of the top half of the capsule is approximately 700 degrees Celsius, as measured by type K thermocouples. The temperatures are held at these values for 54 hr. The cell is cooled and removed from the press.

Figure 10:
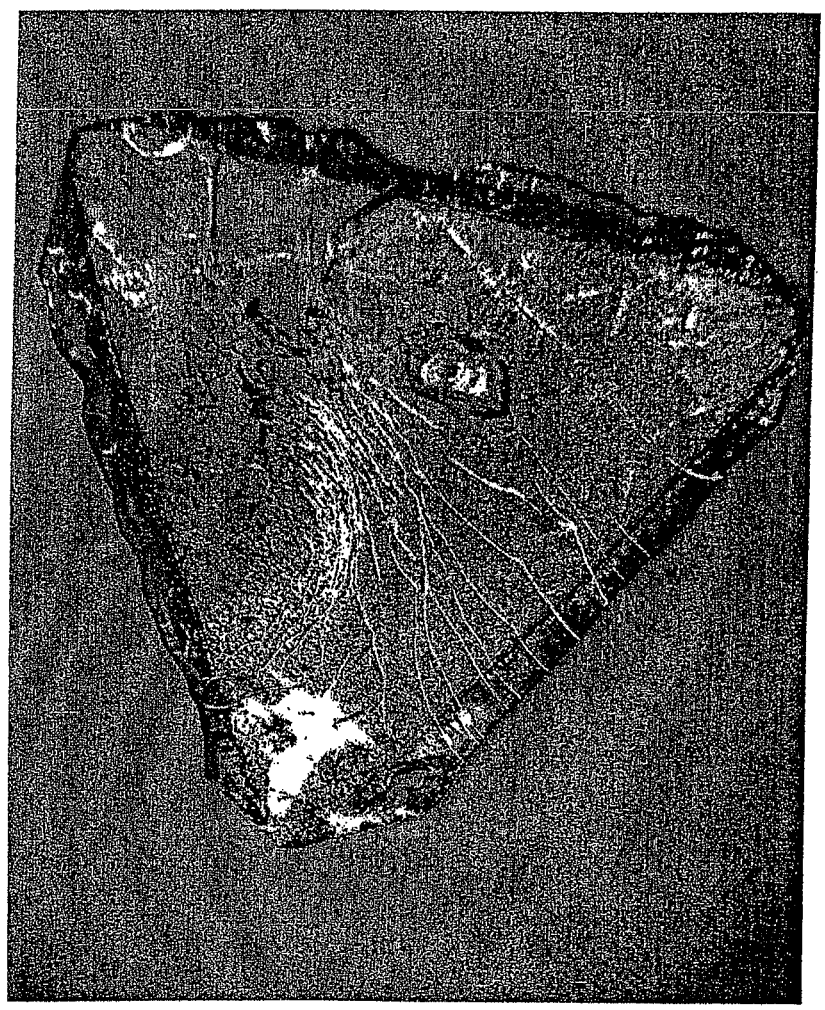
FIG. 10 is a photograph of a crystalline composition grown by a method in accordance with an embodiment of the invention.

Upon opening the capsule after venting of the ammonia, the seed has grown laterally to about 20×20×20 mm. The growth rate lateral to the c axis is approximately 37 μm/hr. The crystal, shown in FIG. 10, comprised essentially dislocation-free material on the edge area. The crystalline composition as grown is transparent without any visible cracks, two-dimensional boundaries, or other defects.

Example 11

A 18×13×0.20 millimeters thick triangle shape gallium nitride seed crystal is hung from a 25 percent open-area baffle and placed inside a 1.1 inch diameter silver capsule. 1.0 grams of $NH_4F$ and 14.655 grams of polycrystalline gallium nitride are added to the capsule inside a glove box, a lid with a 0.12 inch diameter fill tube is welded to the top of the capsule. The fill tube is attached to a gas manifold without any air exposure to the contents and the capsule is evacuated, filled with 8.35 grams of $NH_3$. The fill tube is welded shut. The capsule is placed in a cell in a zero-stroke high-pressure apparatus. The cell is heated until the temperature of the bottom of the capsule is approximately 700 degrees Celsius and the temperature of the top half of the capsule is approximately 660 degrees Celsius, as measured by type K thermocouples. The temperatures are held at these values for 99 hr. The cell is cooled and removed from the press.

Upon opening the capsule after venting of the ammonia, the lateral dimensions of the seed remained the same, about 18×13 mm. The crystalline composition is wedge shaped, with the thickness ranging from 0.50 millimeters on the end near the baffle to 2.36 millimeters on the end near the bottom of the capsule. The growth rate is 5 microns/hr along the C (0001) direction on the thin end and 22 microns/hr on the thick end. The crystalline composition is dark green but transparent without any visible cracks, two-dimensional boundaries, or other defects.

Example 12

A 1×1 cm$^2$ size gallium nitride seed, 880 μm thick, is hung from a 10 percent open-area baffle and placed inside a 1.1 inch diameter silver capsule. 1.147 grams of $GaF_3$ and 10.112 grams of polycrystalline gallium nitride are added to the capsule inside a glove box, a lid with a 0.12 inch diameter fill tube is welded to the top of the capsule. The fill tube is attached to a gas manifold without any air exposure to the contents and the capsule is evacuated, and filled with 8.35 grams of $NH_3$. The fill tube is welded shut. The capsule is placed in a cell in a zero-stroke high-pressure apparatus. The cell is heated until the temperature of the bottom of the capsule is approximately 750 degrees Celsius and the temperature of the top half of the capsule is approximately 705 degrees Celsius, as measured by type K thermocouples. The temperatures are held at these values for 56.5 hours. The cell is cooled and removed from the press.

Upon opening the capsule after venting of the ammonia, the seed has increased in thickness to 1520 mm, indicating a growth rate of 11.3 microns/hr growth rate along the c (0001) direction.

Example 13

1.53 grams of $NH_4F$ and 1.53 grams of polycrystalline gallium nitride are added to about 1.25 centimeters silver capsule without any ammonia. The sealed capsule is placed in a cell in a zero-stroke high-pressure apparatus and heated to 700 degrees Celsius, held at temperature for 13 hours, and cooled. 0.42 of $NH_3$ gas formed by reaction of $NH_4F$ with gallium nitride during the high temperature process is released when the capsule is opened. A well-faceted, spontaneously-nucleated gallium nitride crystalline composition is recovered from the bottom of the capsule. An equivalent of about 0.62 grams of $NH_4F$ remains (1.53-37/17×0.42), which implies that gallium nitride growth occurs in 40 mole percent $NH_4F$.

Example 14

A slot of 1.3×6.1 millimeters is laser-cut in the center of a 10×16×0.2 millimeters HVPE gallium nitride crystal. The gallium nitride seed crystal is hung from a 25 percent open-area baffle and placed inside a 1 inch diameter silver capsule. 1.0 grams of $NH_4F$ and 12.79 grams of polycrystalline gallium nitride are added to the capsule inside a glove box, a lid with a 0.12 inch diameter fill tube is welded to the top of the capsule. The fill tube is attached to a gas manifold without any air exposure to the contents and the capsule is evacuated, filled with 8.17 grams of $NH_3$. The fill tube is welded shut. The capsule is placed in a cell in a zero-stroke high-pressure apparatus. The cell is heated until the temperature of the bottom of the capsule is approximately 700 degrees Celsius and the temperature of the top half of the capsule is approximately 660 degrees Celsius, as measured by type K thermocouples. The temperatures are held at these values for 94 hours. The cell is cooled and removed from the press.

Upon opening the capsule after venting of the ammonia, the slot is covered over and sealed by newly grown gallium nitride crystalline composition. The slot is transparent and sealed with high quality new crystalline composition without any visible cracks, boundary or other defects, though a seam/boundary would be expected in the center of the slot.

Example 15

A 1.9 millimeters×5.1 millimeters slot is laser-cut in the center of an 8.8 millimeters×15.1 millimeters×0.2 millimeters HVPE gallium nitride crystal. The gallium nitride seed crystal is hung from a 4 percent open-area baffle and placed inside a 1.1 inch diameter silver capsule. 1.0 grams of $NH_4F$ and 10.03 grams of polycrystalline gallium nitride are added to the capsule inside a glove box, a lid with a 0.12 inch diameter fill tube is welded to the top of the capsule. The fill tube is attached to a gas manifold without any exposure of the contents to air and the capsule is first evacuated and filled with 8.54 grams of $NH_3$. The fill tube is welded shut. The capsule is placed in a cell in a zero-stroke high-pressure apparatus. The cell is heated until the temperature of the bottom of the capsule is approximately 700 degrees Celsius and the temperature of the top half of the capsule is approximately 665 degrees Celsius, as measured by type K thermocouples. The temperatures are held at these values for 60 hr. The cell is cooled and removed from the press.

Upon opening the capsule after venting of the ammonia, the slot is covered over by newly grown crystalline gallium nitride, which is clear and nearly colorless. X-ray diffraction studies are performed on this region. For the (0002) reflection, the intensity vs. ω (rocking curve) measurement yielded a full width at half maximum (FWHM) of 35 arc-seconds. The impurity levels, as determined by calibrated secondary ion mass spectrometry (SIMS), on the gallium surface of the portion of the gallium nitride crystalline composition grown in the slot are found to be: oxygen, $5×10^{17}$ cm$^{-3}$; hydrogen, $3×10^{18}$ cm$^{-3}$; carbon, $4×10^{16}$ cm$^{-3}$; and silicon, $6×10^{15}$ cm$^{-3}$. On the nitrogen surface of the same portion of the gallium nitride crystalline composition the corresponding impurity levels are found to be: oxygen, $4×10^{17}$ cm$^{-3}$; hydrogen, $2×10^{18}$ cm$^{-3}$; carbon, $5×10^{16}$ cm$^{-3}$; and silicon, $2×10^{16}$ cm$^{-3}$.

Example 16

A series of undoped gallium nitride crystalline composition are produced in accordance with an Example process disclosed above. The gallium nitride crystalline compositions produced in sample 1 are undoped, transparent and colorless; in sample 2 are opaque and are semi-insulating; and in sample 3 are transparent and are p-type conducting at about room temperature. The gallium nitride crystalline compositions in samples 4-20 include other compositions as listed in Table 1.

The samples 4-20 are processed into wafers. Such wafer processing includes polishing, etching, and edge chamfering. The wafers are evaluated as semi-conductor chips in electronics applications. The electronics applications include, variously and according to the wafer characteristics: a light emitting diode, a laser diode, a photodetector, an avalanche photodiode, a p-i-n diode, a metal-semiconductor-metal diode, a Schottky rectifier, a high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, and a quantum dot infrared photodetector.

A method for forming gallium nitride crystalline composition material described above enables growth of larger high-quality gallium nitride crystals. These gallium nitride crystalline compositions may enable the fabrication of electronic and optoelectronic devices having relatively improved efficiency, reliability, yield, power performance, breakdown voltage, and reduced dark current and defect- and trap-induced noise.

TABLE 1

| Sample number | Other material |
| --- | --- |
| Sample 4 | 5 mole % aluminum |
| Sample 5 | 5 mole % arsenic |
| Sample 6 | 5 mole % boron |
| Sample 7 | 5 mole % indium |
| Sample 8 | 5 mole % phosphorus |
| Sample 9 | 2.5 mole % aluminum |
|  | 2 mole % indium |
| Sample 10 | 2.5 mole % aluminum |
|  | 2 mole % phosphorus |
| Sample 11 | 2.5 mole % aluminum |
|  | 2.5 mole % arsenic |
| Sample 12 | 2.5 mole % indium |
|  | 2.5 mole % phosphorus |
| Sample 13 | 2.5 mole % indium |
|  | 2.5 mole % arsenic |
| Sample 14 | 0.5 mole % phosphorus |
|  | 3.5 mole % arsenic |
| Sample 15 | 3.5 mole % aluminum |
|  | 1.5 mole % boron |
| Sample 16 | 2.5 mole % arsenic |
|  | 2.5 mole % boron |
| Sample 17 | 0.5 mole % boron |
|  | 0.05 mole % indium |
| Sample 18 | 0.05 mole % boron |
|  | 0.05 mole % phosphorus |
| Sample 19 | 1.25 mole % phosphorus |
|  | 1.25 mole % arsenic |
|  | 1.25 mole % indium |
|  | 1.25 mole % aluminum |
| Sample 20a | 1 mole % aluminum |
|  | 1 mole % arsenic |
|  | 1 mole % boron |
|  | 1 mole % indium |
|  | 1 mole % phosphorus |
| Sample 20b | 3 mole % aluminum |
|  | 0.02 mole % arsenic |
|  | 0.01 mole % boron |
|  | 0.5 mole % indium |
|  | 0.01 mole % phosphorus |

Reference is made to substances, components, or ingredients in existence at the time just before first contacted, formed in situ, blended, or mixed with one or more other substances, components, or ingredients in accordance with the present disclosure. A substance, component or ingredient identified as a reaction product, resulting mixture, or the like may gain an identity, property, or character through a chemical reaction or transformation during the course of contacting, in situ formation, blending, or mixing operation if conducted in accordance with this disclosure with the application of common sense and the ordinary skill of one in the relevant art (e.g., chemist). The transformation of chemical reactants or starting materials to chemical products or final materials is a continually evolving process, independent of the speed at which it occurs. Accordingly, as such a transformative process is in progress there may be a mix of starting and final materials, as well as intermediate species that may be, depending on their kinetic lifetime, easy or difficult to detect with current analytical techniques known to those of ordinary skill in the art.

Reactants and components referred to by chemical name or formula in the specification or claims hereof, whether referred to in the singular or plural, may be identified as they exist prior to coming into contact with another substance referred to by chemical name or chemical type (e.g., another reactant or a solvent). Preliminary and/or transitional chemical changes, transformations, or reactions, if any, that take place in the resulting mixture, solution, or reaction medium may be identified as intermediate species, master batches, and the like, and may have utility distinct from the utility of the reaction product or final material. Other subsequent changes, transformations, or reactions may result from bringing the specified reactants and/or components together under the conditions called for pursuant to this disclosure. In these other subsequent changes, transformations, or reactions the reactants, ingredients, or the components to be brought together may identify or indicate the reaction product or final material.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

What is claimed is:

1. A method of forming a GaN single crystal in a chamber having a first region having a first end and a second region having a second end, said method comprising:

disposing a nucleation center in said first region and a GaN source material in said second region;

pressurizing the chamber;

heating the chamber to a growth temperature;

establishing and holding for a first time period of at least 1 minute, which occurs after heating the chamber to the growth temperature, a first temperature distribution in said chamber in which a first non-zero temperature gradient exists between a first temperature at said first end and a second temperature at said second end; and establishing and holding for a second time period, which is subsequent to the first time period, a second temperature distribution in said chamber in which a second non-zero temperature gradient exists between a third temperature at said first end and a fourth temperature said second end, said third temperature being sufficient to cause growth of at least one GaN single crystal in said first region, and said fourth temperature being sufficient to cause etching of said GaN source material in said second region,
wherein said second non-zero temperature gradient is larger in magnitude than the first non-zero temperature gradient.

2. The method of forming a GaN single crystal of claim 1, wherein a difference between the first temperature and the second temperature is 10 degrees Celsius or less.

3. The method of forming a GaN single crystal of claim 1, wherein the nucleation center comprises one or more GaN single crystal seeds.

4. The method of forming a GaN single crystal of claim 1, wherein the GaN single crystal is grown at a rate of at least 5 micrometers per hour.

5. The method of forming a GaN single crystal of claim 1, wherein the GaN single crystal is grown at a rate of at least 11.3 micrometers per hour.

6. The method of forming a GaN single crystal of claim 3, wherein at least one seed crystal is hung by a wire, the first region is kept separate from the second region by a baffle having between 1% and 50% open area, the GaN solvent comprises ammonia, and the GaN source material comprises at least one of single crystal GaN, amorphous GaN, polycrystalline GaN, and a GaN precursor.

7. The method of forming a GaN single crystal of claim 1, wherein the GaN single crystal formed has a maximum dimension of at least 2 millimeters, a dislocation density of less than $10^4$ cm$^{-2}$, and substantially no tilt boundaries.

8. The method of forming a GaN single crystal of claim 1, further comprising disposing a mineralizer within the chamber, wherein the mineralizer comprises at least one of: alkali and alkaline-earth nitrides, amides, urea and related compounds, ammonium salts, rare earth salts, halide salts, sulfide salts, nitrate salts, azide salts, compounds formed by chemical reaction of Ga and/or GaN with at least one of the above, and mixtures thereof.

9. The method of forming a GaN single crystal of claim 1, wherein the GaN solvent comprises ammonia and further comprises a mineralizer, comprising at least one of hydrogen halide, ammonium halide, gallium halide, gallium tri halide, or a compound produced by chemical reactions between the hydrogen halide and one or more of ammonia ($NH_3$), gallium, or gallium nitride and is present at a concentration of 0.5 to 90 atomic % with respect to the ammonia in the GaN solvent.

10. The method of forming a GaN single crystal of claim 9, wherein the halide comprises fluorine, chlorine, or a combination of fluorine and chlorine.

11. The method of forming a GaN single crystal of claim 1, further comprising providing a dopant source for doping of n-type, semi-insulating, or p-type GaN crystals, and wherein the dopant source comprises at least one dopant selected from H, Be, C, O, Si, Ge, Be, Mg, Zn, Ca, Sc, Ti, V, Cr, Mn, Fe, Co, Ni, Cu, Zr, Hf, and a rare earth metal.

12. The method of forming a GaN single crystal of claim 11, wherein the dopant source is provided at level that generates a dopant concentration within the GaN single crystal between $10^{15}$ cm$^{-3}$ and $10^{21}$ cm$^{-3}$.

13. The method of forming a GaN single crystal of claim 1, further comprising providing a getter, wherein the getter comprises one or more of alkaline earth metals, Sc, Ti, V, Cr, Y, Zr, Nb, Hf, Ta, W, or a rare earth metal.

14. The method of forming a GaN single crystal of claim 1, further comprising processing at least one GaN single crystal into wafers.

15. The method of forming a GaN single crystal of claim 14, wherein the further processing includes one or more of sawing, grinding, lapping, polishing, and chemical mechanical polishing.

16. The method of forming a GaN single crystal of claim 1, further comprising:
setting, for a third time period prior to the second time period, a third temperature distribution in the chamber in which a third temperature gradient exists between a fifth temperature at the first end and a sixth temperature at the second end, wherein the third temperature gradient has a sign that is opposite to the sign of the first non-zero temperature gradient and the second non-zero temperature gradient.

17. The method of forming a GaN single crystal of claim 1, wherein
a difference between the first temperature and the second temperature is at least 3 degrees Celsius.

18. The method of forming a GaN single crystal of claim 1, further comprising disposing a mineralizer within the chamber, wherein the mineralizer comprises fluorine.

19. The method of forming a GaN single crystal of claim 1, wherein the growth temperature is between 550 degrees Celsius and 900 degrees Celsius.

20. The method of forming a GaN single crystal of claim 1, wherein the second non-zero temperature gradient has the same sign as the first non-zero temperature gradient.

21. The method of forming a GaN single crystal of claim 1, wherein the first time period is less than or equal to two hours.

* * * * *

UNITED STATES PATENT AND TRADEMARK OFFICE
CERTIFICATE OF CORRECTION

Page 1 of 1

PATENT NO. : 10,975,492 B2
APPLICATION NO. : 16/246065
DATED : April 13, 2021
INVENTOR(S) : Mark Philip D'Evelyn et al.

It is certified that error appears in the above-identified patent and that said Letters Patent is hereby corrected as shown below:

In the Specification

Column 1, Lines 29 - 33, delete "The United States Government may have certain rights in this invention pursuant to Cooperative Agreement No. 70NANB9H3020, awarded by the National Institute of Standards and Technology, United States Department of Commerce." and replace with
-- This invention was made with government support under Cooperative Agreement No. 70NANB9H3020 awarded by the National Institute of Standards and Technology, United States Department of Commerce. The government has certain rights in the invention. --

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*